United States Patent
Kusakari

(10) Patent No.: US 11,038,499 B2
(45) Date of Patent: Jun. 15, 2021

(54) GATE DRIVE APPARATUS AND SWITCHING APPARATUS

(71) Applicant: FUJI ELECTRIC CO., LTD., Kanagawa (JP)

(72) Inventor: Nobuharu Kusakari, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/368,760

(22) Filed: Mar. 28, 2019

(65) Prior Publication Data
US 2019/0348977 A1    Nov. 14, 2019

(30) Foreign Application Priority Data
May 10, 2018 (JP) .............................. JP2018-091618

(51) Int. Cl.
*H03K 17/687* (2006.01)
*H03K 17/06* (2006.01)

(52) U.S. Cl.
CPC ... *H03K 17/063* (2013.01); *H03K 2217/0045* (2013.01); *H03K 2217/0081* (2013.01)

(58) Field of Classification Search
CPC ....... H03K 19/00361; H03K 19/00315; H03K 19/00384; H04L 25/028; H04L 25/0272
USPC ................................. 327/108, 112, 427, 434
See application file for complete search history.

(56) References Cited

U.S. PATENT DOCUMENTS

| | | | | |
|---|---|---|---|---|
| 8,258,823 B2 * | 9/2012 | Prior | ....................... | H02M 1/08 327/108 |
| 10,243,549 B2 * | 3/2019 | Ohashi | ................ | H03K 17/567 |
| 10,243,552 B2 * | 3/2019 | Ohashi | ................... | H02M 1/08 |
| 2010/0141304 A1 | 6/2010 | Miyazaki | | |

FOREIGN PATENT DOCUMENTS

| | | |
|---|---|---|
| EP | 2164155 A1 | 3/2010 |
| JP | 2009201110 A | 9/2009 |
| JP | 2013110924 A * | 6/2013 |
| WO | 2009004715 A1 | 1/2009 |

* cited by examiner

*Primary Examiner* — Quan Tra

(57) ABSTRACT

A drive apparatus that drives a control terminal of a main switching element establishing/cutting off an electrical connection between a first main terminal and a second main terminal is provided, including first to fourth switching elements establishing/cutting off electrical connections between a positive terminal of a power source and the control terminal, the positive terminal and the second main terminal, the control terminal and a negative terminal of the power source, and the second main terminal and the negative terminal, respectively, and a resistance of at least one among a path between the control terminal and the second main terminal via the first to second switching elements, a path via the first and fourth switching elements, a path via the second to third switching elements, and a path via the third to fourth switching element is different from a resistance of at least one of the others.

20 Claims, 14 Drawing Sheets

| CONNECTION MODE | SW1 | SW2 | SW3 | SW4 | Vgs(V) | GATE DRIVE RESISTANCE |
|---|---|---|---|---|---|---|
| 1 | ON | ON | OFF | OFF | 0 | R1+R2 |
| 2 | ON | OFF | OFF | ON | Vin | R1+R4 |
| 3 | OFF | ON | ON | OFF | −Vin | R2+R3 |
| 4 | OFF | OFF | ON | ON | 0 | R3+R4 |

FIG.2

| CONNECTION CODE | SW1 | SW2 | SW3 | SW4 | Vgs(V) | GATE DRIVE RESISTANCE |
|---|---|---|---|---|---|---|
| 0 | ON | ON | ON | ON | — | — |
| 1 | ON | ON | ON | OFF | — | — |
| 2 | ON | ON | OFF | ON | — | — |
| 3 | ON | ON | OFF | OFF | 0 | R1+R2 |
| 4 | ON | OFF | ON | ON | — | — |
| 5 | ON | OFF | ON | OFF | — | — |
| 6 | ON | OFF | OFF | ON | Vin | R1+R4 |
| 7 | ON | OFF | OFF | OFF | (−Vd2) | R1+Rd2 |
| 8 | OFF | ON | ON | ON | — | — |
| 9 | OFF | ON | ON | OFF | −Vin | R2+R3 |
| 10 | OFF | ON | OFF | ON | — | — |
| 11 | OFF | ON | OFF | OFF | (Vd1) | Rd1+R2 |
| 12 | OFF | OFF | ON | ON | 0 | R3+R4 |
| 13 | OFF | OFF | ON | OFF | (Vd4) | R3+Rd4 |
| 14 | OFF | OFF | OFF | ON | (−Vd3) | Rd3+R4 |
| 15 | OFF | OFF | OFF | OFF | (−) | (−) |

*FIG.7*

| CONNECTION MODE | SW1 | SW2 | SW3 | SW4 | Vgs(V) | GATE DRIVE RESISTANCE |
|---|---|---|---|---|---|---|
| 1 | ON | ON | OFF | OFF | 0 | R1+R2a+R2b |
| 2 | ON | OFF | OFF | ON | Vin | R1+R4a+R4b |
| 3 | OFF | ON | ON | OFF | −Vin | R2a+R2b+R3 |
| 4 | OFF | OFF | ON | ON | 0 | R3+R4a+R4b |

FIG.9

| CONNECTION MODE | SW1 | SW2 | SW3 | SW4 | Vgs(V) | GATE DRIVE RESISTANCE |
|---|---|---|---|---|---|---|
| 1 | ON | ON | OFF | OFF | Vin1−Vin2 | R1+R2 |
| 2 | ON | OFF | OFF | ON | Vin1 | R1+R4a+R4b |
| 3 | OFF | ON | ON | OFF | −Vin2 | R2+R3 |
| 4 | OFF | OFF | ON | ON | 0 | R3+R4a+R4b |

FIG.11

GATE DRIVE APPARATUS AND SWITCHING APPARATUS

The contents of the following Japanese patent application(s) are incorporated herein by reference:
No. 2018-091618 filed in JP on May 10, 2018

BACKGROUND

1. Technical Field

The present invention relates to a gate drive apparatus and a switching apparatus.

2. Related Art

About switching circuits that use power semiconductor elements as main switching elements, conventionally proposed drive circuits include one that can apply a positive bias and a negative bias to the gate (or base) of a main switching element using one power source (see Patent Literatures 1 and 2).

Patent Literature 1: Japanese Patent Application Publication No. 2009-201110

Patent Literature 2: WO2009/004715

If turning on/turning off of the main switching element is early, current flowing through the main switching element changes abruptly, and a voltage that is applied to the main switching element overshoots, and so on, which possibly results in the main switching element's shorter lifetime. If turning on/turning off of the main switching element is late, the transition period becomes long, and the switching loss increases. Because of this, it is desired to be able to flexibly configure the rate of transition for turning on/turning off of the main switching element according to current to flow through the switching circuit, a voltage to be applied to the switching circuit, and/or the state of biasing of the gate, and the like.

SUMMARY

In order to overcome the above-mentioned drawbacks, a first aspect of the present invention provides a drive apparatus that drives a control terminal of a main switching element that establishes or cuts off an electrical connection between a first main terminal and a second main terminal, the drive apparatus including: a first switching element that establishes or cuts off an electrical connection between a positive terminal of at least one power source and the control terminal; a second switching element that establishes or cuts off an electrical connection between the positive terminal of the power source and the second main terminal; a third switching element that establishes or cuts off an electrical connection between the control terminal and a negative terminal of the power source; and a fourth switching element that establishes or cuts off an electrical connection between the second main terminal and the negative terminal of the power source, wherein at least one resistance among: a first path resistance in a first path establishing a connection between the control terminal and the second main terminal via the first switching element and the second switching element; a second path resistance in a second path establishing a connection between the control terminal and the second main terminal via the first switching element and the fourth switching element; a third path resistance in a third path establishing a connection between the control terminal and the second main terminal via the second switching element and the third switching element; and a fourth path resistance in a fourth path establishing a connection between the control terminal and the second main terminal via the third switching element and the fourth switching element, is different from at least one of the other resistances.

A second aspect of the present invention provides a drive apparatus that drives a control terminal of a main switching element that establishes or cuts off an electrical connection between a first main terminal and a second main terminal, the drive apparatus including: a first switching element that establishes or cuts off an electrical connection between a positive terminal of a power source and the control terminal; a second switching element that establishes or cuts off an electrical connection between the positive terminal of the power source and the second main terminal; a third switching element that establishes or cuts off an electrical connection between the control terminal and a negative terminal of the power source; a fourth switching element that establishes or cuts off an electrical connection between the second main terminal and the negative terminal of the power source; and a drive control unit that controls the first switching element, the second switching element, the third switching element and the fourth switching element, wherein during at least one switching of: switching from a connection through a second path establishing a connection between the control terminal and the second main terminal via the first switching element and the fourth switching element to a connection through a third path establishing a connection between the control terminal and the second main terminal via the second switching element and the third switching element; and switching from a connection through the third path to a connection through the second path, the drive control unit provides at least one of: a period during which a connection through a first path to establish a connection between the control terminal and the second main terminal is established via the first switching element and the second switching element; and a period during which a connection through a fourth path to establish a connection between the control terminal and the second main terminal is established via the third switching element and the fourth switching element.

A third aspect of the present invention provides a switching apparatus including: the drive apparatus; and the main switching element.

The summary clause does not necessarily describe all necessary features of the embodiments of the present invention. The present invention may also be a sub-combination of the features described above.

BRIEF DESCRIPTION OF THE DRAWINGS

FIG. 2 illustrates connection modes of a drive apparatus 110 according to the present embodiment.

FIG. 7 illustrates a variant of connection modes of the drive apparatus 110 according to the present embodiment.

FIG. 9 illustrates connection modes of the drive apparatus 110 according to the first variant.

FIG. 11 illustrates connection modes of the drive apparatus 110 according to the second variant.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
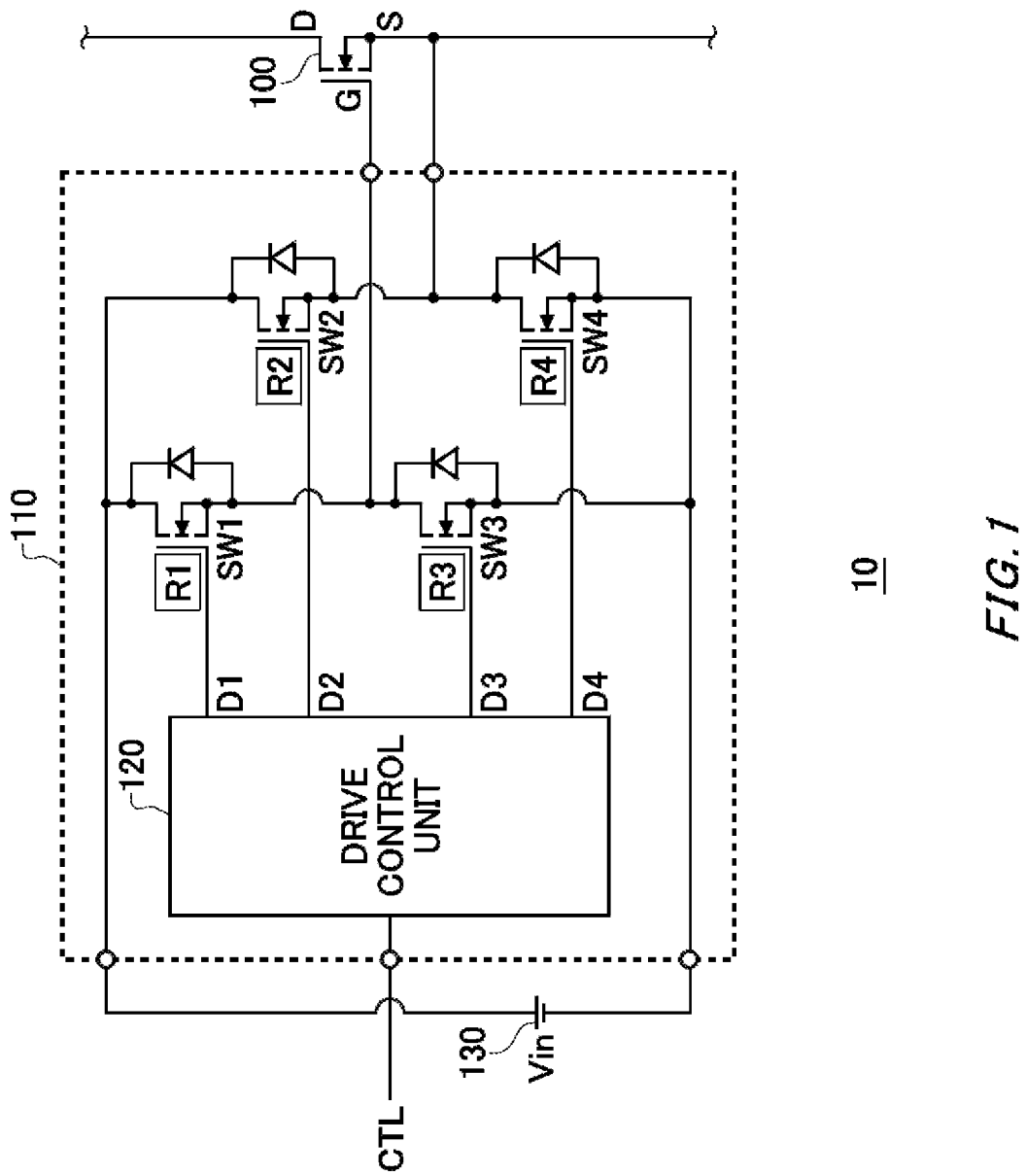
FIG. 1 illustrates the configuration of a switching apparatus 10 according to the present embodiment.

FIG. 1 illustrates the configuration of a switching apparatus 10 according to the present embodiment. The switching apparatus 10 includes a main switching element 100, a drive apparatus 110 and a power source 130. The main switching element 100, for example, is a power semiconductor element, has a control terminal, a first main terminal and a second main terminal, and establishes (turns on) or cuts off (turns off) an electrical connection between the first main terminal and the second main terminal according to a voltage or current input to the control terminal. In the present embodiment, the main switching element 100, for example, is an nMOS transistor having the gate as the control terminal, the drain as the first main terminal, and the source as the second main terminal, and is turned off if a voltage (also denoted as "bias voltage") across the control terminal relative to the second main terminal, that is, for example a gate-source voltage Vgs, is equal to or lower than a threshold voltage Vth, and is turned on if the gate-source voltage Vgs exceeds Vth.

Although in the present embodiment, an example in which the main switching element 100 is an nMOS transistor is explained, each embodiment explained in the present application can be applied to various types of the main switching element 100 such as a MOS transistor having a control terminal which is referred to as the gate, and two main terminals which are referred to as the drain and source, an IGBT (insulated gate bipolar transistor) having a control terminal which is referred to as the gate, and two main terminals which are referred to as the collector and emitter, or a bipolar transistor having a control electrode which is referred to as the base, and two main electrodes which are referred to as the collector and emitter.

Upon being supplied with a power source voltage Vin from the power source 130, the drive apparatus 110 drives the control terminal (the gate in the figure) of the main switching element 100 according to a control signal CTL input from the outside. Thereby, the drive apparatus 110 performs switching of ON/OFF between the first main terminal and the second main terminal (between the drain and the source in the figure) of the main switching element 100. The drive apparatus 110 may be realized by one or more integrated circuits having the control terminal and second main terminal of the main switching element 100, the positive terminal and negative terminal of the power source 130, and a plurality of terminals for input or output of the control signal CTL, or may be realized by a combination of a plurality of discrete components. The drive apparatus 110 has a first switching element SW1, a second switching element SW2, a third switching element SW3, a fourth switching element SW4 and a drive control unit 120.

The first switching element SW1 is provided between the positive terminal of the power source 130 and the control terminal of the main switching element 100, and establishes or cuts off an electrical connection between the positive terminal of the power source 130 and the control terminal of the main switching element 100. The second switching element SW2 is provided between the positive terminal of the power source 130 and the second main terminal of the main switching element 100, and establishes or cuts off an electrical connection between the positive terminal of the power source 130 and the second main terminal of the main switching element 100. The third switching element SW3 is provided between the control terminal of the main switching element 100 and the negative terminal of the power source 130, and establishes or cuts off an electrical connection between the control terminal of the main switching element 100 and the negative terminal of the power source 130. The fourth switching element SW4 is provided between the second main terminal of the main switching element 100 and the negative terminal of the power source 130, and establishes or cuts off an electrical connection between the second main terminal of the main switching element 100 and the negative terminal of the power source 130. Here, each among the first to fourth switching elements SW1-4 may be a semiconductor switching element such as a MOS transistor or a bipolar transistor, and turns on or off the state of a connection between the main terminals (between the drain and the source, or between the collector and the emitter) according to a drive signal input to the control terminal (the gate or base). In the present embodiment, each among the first to fourth switching elements SW1-4, for example, is an nMOS transistor, and is turned off if the gate-source voltage becomes equal to or lower than a threshold voltage, and is turned on if the gate-source voltage exceeds the threshold voltage.

Note that, in the specification of the present application, phrases like "an element is provided between two terminals" refer not only to configurations in which "the element is connected directly electrically to the two terminals", but also to configurations in which the element is electrically connected to the terminals, with another element/other elements or the like interposed therebetween unless noted otherwise. Similarly, phrases like "an element A is electrically connected to an element B" refer not only to configurations in which the elements A and B are directly electrically connected, but also to configurations in which the elements A and B are indirectly electrically connected, with another element/other elements or the like being connected therebetween.

In the present embodiment, a first connection resistance between the positive terminal of the power source and the control terminal via the first switching element SW1 is defined as R1, a second connection resistance between the positive terminal of the power source and the second main terminal via the second switching element SW2 is defined as R2, a third connection resistance between the control terminal and the negative terminal of the power source via the third switching element SW3 is defined as R3, and a fourth connection resistance between the second main terminal and the negative terminal of the power source via the fourth switching element SW4 is defined as R4. These connection resistances may be a combined resistance produced by a switching element and other elements connected between two points, and if the resistance of a wire is not negligible, the wire resistance may be included in the combined resistance. If the wire is the only member provided between the two points other than the switching element, and the resistance of the wire is negligible, the switching element is equivalent to the resistor in the case where the two points are in a connection state.

According to the control signal CTL input from the outside, the drive control unit 120 outputs a drive signal D1 to drive the control terminal of the first switching element SW1, a drive signal D2 to drive the control terminal of the second switching element SW2, a drive signal D3 to drive the control terminal of the third switching element SW3, and a drive signal D4 to drive the control terminal of the fourth switching element SW4, and controls the first to fourth switching elements SW1-4. The drive control unit 120 may be realized by a dedicated hardware circuit that may include a state machine or the like, may be realized by a programmable circuitry such as a field-programmable gate array (FPGA), or may be realized by execution of a program at a micro controller, and so on.

The power source 130 generates, between the positive terminal and the negative terminal, the power source voltage Vin that the drive apparatus 110 uses for applying a positive bias voltage or a negative bias voltage between the control terminal and second main terminal of the main switching element 100.

FIG. 2 illustrates connection modes of the drive apparatus 110 according to the present embodiment. The drive control unit 120 controls the signal values of the drive signals D1-D4, and switches ON/OFF of the first to fourth switching elements SW1-4 to thereby switch the connection path between the control terminal and second main terminal of the main switching element 100. Thereby, the drive control unit 120 can switch the bias voltage (or bias current) to be applied to the control terminal of the main switching element 100.

In a connection mode 1, the drive control unit 120 turns on the first switching element SW1 and second switching element SW2, and turns off the third switching element SW3 and fourth switching element SW4 so as to establish a connection between the control terminal and second main terminal of the main switching element 100 via the first switching element SW1 and second switching element SW2. In the present embodiment, the drive control unit 120 supplies the control terminals of the first to second switching elements SW1-2 with the drive signals D1-2 having logic H, and turns them on, and supplies the control terminals of the third to fourth switching element SW3-4 with the drive signals D3-4 having logic L, and turns them off. Here, if the first to fourth switching elements SW1-4 have parasitic diodes (or diodes connected in anti-parallel; the same applies hereinbelow) as shown in FIG. 1, the drive control unit 120 may make the switching elements enter the conducting state via the parasitic diodes without supplying the switching elements with drive signals having logic H. For example, if the voltage across the control terminal of the main switching element 100 is higher than the voltage across the second main terminal, the drive control unit 120 may give the drive signal D1 logic L, and make the first switching element SW1 enter the conducting state through the parasitic diode. In addition, if the voltage across the control terminal is lower than the voltage across the second main terminal, the drive control unit 120 may give the drive signal D2 logic L, and make the second switching element SW2 enter the conducting state through the parasitic diode. Note that a variant in which at least one of the first to fourth switching elements SW1-4 is caused to enter the conducting state via the parasitic diode(s) is explained with reference to FIG. 7.

In the connection mode 1, the drive apparatus 110 forms a first path that establishes a connection between the control terminal and second main terminal of the main switching element 100 via the first switching element SW1 and second switching element SW2. The first path does not include the power source 130, and the voltage ("Vgs (V)" in the figure) between the control terminal and second main terminal becomes almost 0 when in the stable state. But if any of the first to second switching elements SW1-2 is in the conducting state through the parasitic diode, a potential difference is generated between the control terminal and second main terminal due to a forward voltage across the parasitic diode. The first path resistance (the "gate drive resistance" in the figure), which is the resistance between the control terminal and second main terminal in the first path, becomes R1+R2.

In a connection mode 2, the drive control unit 120 turns on the first switching element SW1 and fourth switching element SW4, and turns off the second switching element SW2 and third switching element SW3 so as to establish a connection between the control terminal and second main terminal of the main switching element 100 via the first switching element SW1 and fourth switching element SW4. In the present embodiment, the drive control unit 120 supplies the control terminals of the first switching element SW1 and fourth switching element SW4 with the drive signals D1 and D4 having logic H, and turns them on, and supplies the control terminals of the second to third switching elements SW2-3 with the drive signals D2-3 having logic L, and turns them off.

In the connection mode 2, the drive apparatus 110 forms a second path that establishes a connection between the control terminal and second main terminal of the main switching element 100 via the first switching element SW1 and fourth switching element SW4. The second path includes the power source 130 in the forward direction (the direction in which the control terminal is located on the positive side), and the voltage between the control terminal and second main terminal can be regarded as being the power source voltage Vin when in the stable state. The second path resistance, which is the resistance between the control terminal and second main terminal in the second path, becomes R1+R4.

In a connection mode 3, the drive control unit 120 turns on the second switching element SW2 and third switching element SW3, and turns off the first switching element SW1 and fourth switching element SW4 so as to establish a connection between the control terminal and second main terminal of the main switching element 100 via the second switching element SW2 and third switching element SW3. In the present embodiment, the drive control unit 120 supplies the control terminals of the second to third switching elements SW2-3 with the drive signals D2-3 having logic H, and turns them on, and supplies the control terminals of the first switching element SW1 and fourth switching element SW4 with the drive signals D1 and D4 having logic L, and turns them off.

In the connection mode 3, the drive apparatus 110 forms a third path that establishes a connection between the control terminal and second main terminal of the main switching element 100 via the second switching element SW2 and third switching element SW3. The third path includes the power source 130 in the reverse direction (the direction in which the control terminal is located on the negative side), and the voltage between the control terminal and the second main terminal can be regarded as being the reverse bias value of the power source voltage Vin, that is, −Vin, when in the stable state. The third path resistance, which is the resistance between the control terminal and the second main terminal in the third path, becomes R2+R3.

In a connection mode 4, the drive control unit 120 turns on the third switching element SW3 and fourth switching element SW4, and turns off the first switching element SW1 and second switching element SW2 so as to establish a connection between the control terminal and second main terminal of the main switching element 100 via the third switching element SW3 and the fourth switching element SW4. In the present embodiment, the drive control unit 120 supplies the control terminals of the third to fourth switching elements SW3-4 with the drive signals D3-4 having logic H, and turns them on, and supplies the control terminals of the first to second switching elements SW1-2 with the drive signals D1-2 having logic L, and turns them off. Similar to the connection mode 1, the drive control unit 120 may make any of the third to fourth switching elements SW3-4 enter the conducting state through the parasitic diode. Note that a variant in which at least one of the first to fourth switching elements SW1-4 is caused to enter the conducting state via the parasitic diode(s) is explained with reference to FIG. 7.

In the connection mode 4, the drive apparatus 110 forms a fourth path that establishes a connection between the control terminal and second main terminal of the main switching element 100 via the third switching element SW3 and the fourth switching element SW4. The fourth path does not include the power source 130, and the voltage between the control terminal and second main terminal becomes almost 0 when in the stable state. But if any of the third to fourth switching elements SW3-4 is in the conducting state through the parasitic diode, a potential difference is generated between the control terminal and second main terminal due to a forward voltage across the parasitic diode. The fourth path resistance, which is the resistance between the control terminal and second main terminal in the fourth path, becomes R3+R4.

In the present embodiment, the resistance of each path resistance is configured appropriately so as to configure well the rate of transition of the switching state of the main switching element 100 in each among the case where a positive bias voltage is supplied to the control terminal of the main switching element 100, the case where a negative bias voltage is supplied to the control terminal, and the case where the bias voltage of 0 V is supplied to the control terminal. In the thus-configured drive apparatus 110, at least one resistance among the first path resistance, the second path resistance, the third path resistance and the fourth path resistance is different from at least one of the other resistances.

For example, the second path resistance and the third path resistance may have different resistances. For example, if turning on of the main switching element 100 is caused to occur gradually as compare with turning off of the main switching element 100, the second path resistance may be configured to be higher than the third path resistance.

In addition, for example, the first path resistance and the fourth path resistance may have different resistances. By using different resistances of the first path and the fourth path, both of which make the control terminal of the main switching element 100 zero-biased in the same way, the drive apparatus 110 can properly use zero-biasing of a higher path resistance and zero-biasing of a smaller path resistance for different purposes.

In order to realize such suitable path resistances, the drive apparatus 110 may be configured to have the first connection resistance R1, second connection resistance R2, third connection resistance R3, and fourth connection resistance R4, at least one resistance of which is different from at least one of the other resistances. For example, by configuring the first connection resistance R1 and second connection resistance R2 to be equal, and configuring the third connection resistance R3 smaller than the fourth connection resistance R4, the second path resistance R1+R4 becomes higher than the third path resistance R2+R3, and turning on of the main switching element 100 can be configured to occur gradually as compare with turning off of the main switching element 100.

Here, the phrase "the resistances are different" means that the resistances are substantially different, and means that they are designed to be different resistances. Accordingly, it does not mean that there are variations due to manufacturing errors in the resistances between individual paths and/or individual connections that are designed to have the same resistance. Such substantial differences in resistances may be observed as significant differences in the resistances, which are equal to or larger than 1%, equal to or larger than 3%, equal to or larger than 5%, equal to or larger than 10%, equal to or larger than 20%, or the like, for example, and may be observed as differences in the resistances exceeding the range of precision of the resistances to be used.

Figure 3:
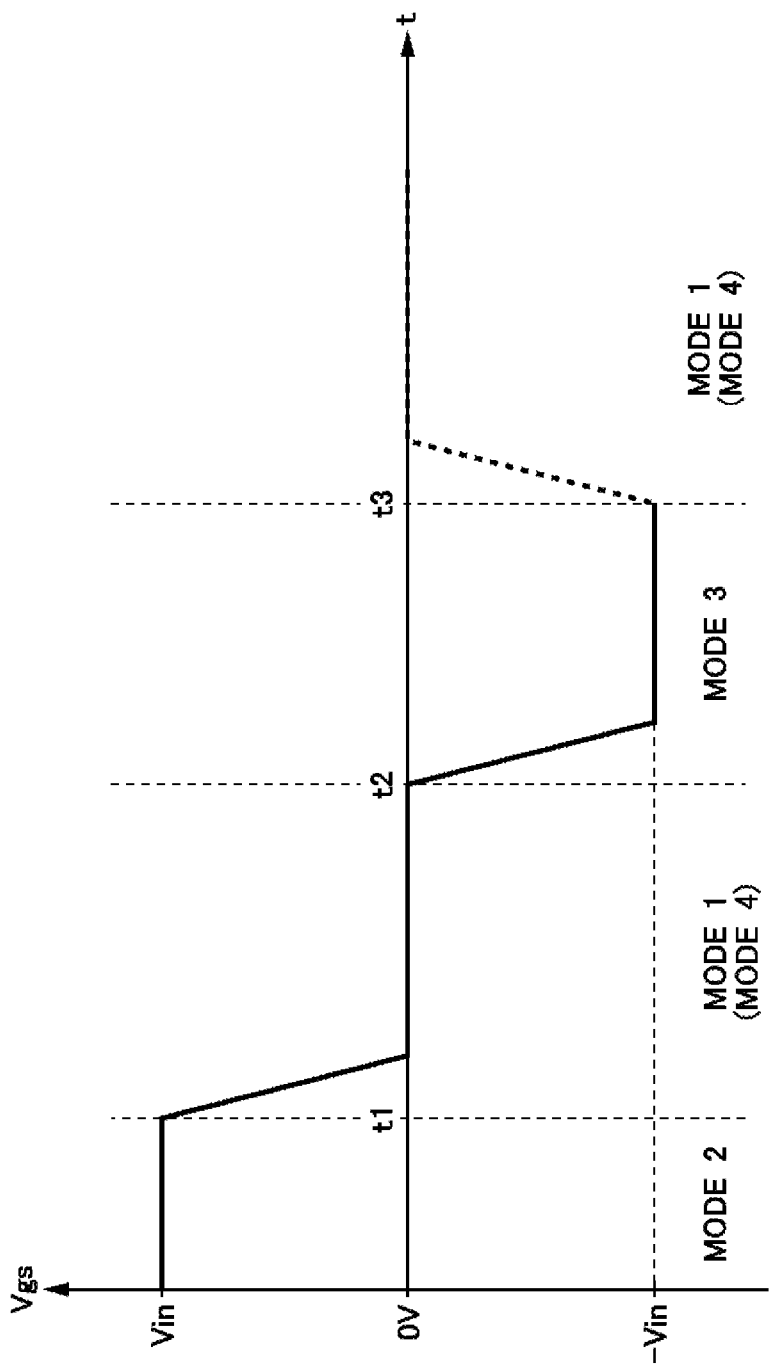
FIG. 3 shows a first example illustrating transitions of a bias voltage across the control terminal of a main switching element 100 according to the present embodiment.

FIG. 3 shows a first example illustrating transitions of a bias voltage across the control terminal of the main switching element 100 according to the present embodiment. In the present example, the drive apparatus 110 turns off the main switching element 100 by changing the bias voltage Vgs across the control terminal of the main switching element 100 from +Vin to −Vin.

Before a time t1, the drive control unit 120 is receiving an input of the control signal CTL (for example, logic H) instructing to make the main switching element 100 enter the ON-state. Upon receiving it, the drive control unit 120 makes the drive apparatus 110 enter the connection mode 2, and is supplying the bias voltage Vgs at +Vin to the control terminal of the main switching element 100. For example, if the threshold voltage across the main switching element 100 is 3 to 8 V, +Vin may be 10 to 20 V. Thereby, the main switching element 100 enters the ON-state.

At the time t1, the drive control unit 120 receives an input of the control signal CTL (for example, logic L) to instruct switching of the main switching element 100 to enter the OFF state.

Upon receiving it, the drive control unit 120 makes the drive apparatus 110 enter the connection mode 1 (or the connection mode 4), and lowers the bias voltage Vgs from +Vin to 0 V. Here, if the threshold voltage Vth of the main switching element 100 has a value between Vin and 0 V (for example 3 to 8 V), the main switching element 100 is turned off.

Here, depending on the characteristics of a system in which the switching apparatus 10 is provided, if the main switching element 100 exits the ON-state and enters the OFF state, and current flowing through the main switching element 100 decreases abruptly, the voltage between the first main terminal and the second main terminal might increase abruptly from almost 0 V to a high voltage. In such a case, the bias voltage Vgs is increased, and the main switching element 100 might be erroneously turned on even in the connection mode 1 (or 4). In view of this, at a time t2, the drive control unit 120 makes the first to fourth switching elements SW1-4 enter the connection mode 3 so as to surely make the main switching element 100 enter the OFF state, and applies the negative bias voltage −Vin to the control terminal.

In this case, the drive control unit 120 may set the period of the connection mode 1 or connection mode 4 between the times t1 and t2 to a predetermined period or longer such that the period during which the bias voltage Vgs is maintained at substantially 0 V between the times t1 and t2 becomes a predetermined minimum maintenance period or longer. This minimum maintenance period may be longer than the transition time of a voltage or current between the first to second main terminals that accompanies turning on or turning off of the main switching element 100, and for example may be several hundred ns or longer. Thereby, the drive apparatus 110 does not change the bias voltage across the control terminal of the main switching element 100 in one go from +Vin to −Vin, but can surely make it 0 V temporarily, and then start the transition to −Vin; therefore, occurrences of noises such as spikes due to switching can be suppressed.

The drive control unit 120 may also maintain the control terminal of the main switching element 100 at the negative bias voltage −Vin after turning off of the main switching element 100 ends. Instead of this, as indicated by a broken line in the figure, in switching of the main switching element 100, the drive control unit 120 may perform switching from a connection through the second path (the connection mode 2) to a connection through the third path (the connection mode 3), then at a time t3 perform switching to a connection through the first path (the connection mode 1) or a connection through the fourth path (the connection mode 4), and then end the switching. If the main switching element 100 is a voltage-controlled switching element, current does not flow almost at all through the path between the control terminal and the second main terminal even if the main switching element 100 is kept negatively biased, but, if the OFF-period of the main switching element 100 is long, power consumption of the power source 130 due to gate leakage current of the main switching element 100 can be suppressed by performing switching of the control terminal from the negatively-biased state to the zero-biased state. In addition, since the period during which a bias voltage is applied to the main switching element 100 can be made shorter, the service life of the main switching element 100 can also be made longer. In addition, if for example there is a finite resistance such as a pull-down resistance between the control terminal and the second main terminal, if the main switching element 100 is a current-controlled switching element, or in other cases also, the drive control unit 120 can suppress power consumption of the power source 130 by the above-mentioned operation.

Furthermore, the magnitude of the third path resistance is configured according to a target rate of transition at which the main switching element 100 is turned off, and in some cases is configured to have a value which is large to some extent so as to avoid occurrences of abrupt current changes. In contrast to this, in the steady state that follows after the main switching element 100 is turned off, it is in some cases desirable to make the resistance between the control terminal and second main terminal of the main switching element 100 low so as to increase noise tolerance. In view of this, in switching of the main switching element 100, after performing switching from the connection through the second path to the connection through the third path, the drive control unit 120 may perform switching to a connection through a path with a smaller path resistance among the connection through the first path and the connection through the fourth path, and then end the switching. Here, if the path resistance of the first path or fourth path used at and after the time t3 is configured to be smaller than the third path resistance, the drive control unit 120 can maintain, at 0 V, the bias voltage across the control terminal more stably in the steady state that follows after the main switching element 100 is turned off.

In the above-mentioned explanations, at least one among the path resistance of the first path or fourth path used between the times t1 and t2, the path resistance of the third path used between the times t2 and t3, and the path resistance of the first path or fourth path used at and after the time t3 may be configured to have a different resistance such that they become suitable resistances in those individual periods.

The drive control unit 120 may have, as fixed values in advance, various types of parameters defining voltage waveforms of the control terminal like those shown above, or instead of this may have the function of making it possible to configure the parameters in a register or the like inside the drive control unit 120 upon receiving an instruction from an external apparatus, may have the function of making it possible to configure the parameters via a terminal of the drive apparatus 110, and so on. Such parameters are, for example, a period of the connection mode 1 (the connection mode 4) provided between the connection mode 2 and the connection mode 3 (the period between the times t1 and t2), and a period of the connection mode 3 (a period from the times t2 to t3).

In addition, the drive control unit 120 may make it possible to configure which of the connection through the first path and the connection through the fourth path is to be used in the connection state where a connection is established between the control terminal and second main terminal of the main switching element 100 bypassing the power source 130. The drive control unit 120 may make it possible to perform such configuration individually for each among multiple types of periods such as a turn-off period, a turn-on period, or an OFF-period after turning off.

In addition, the drive control unit 120 may use the same path or different paths for making the control terminal zero-biased between the times t1 and t2 during a turn-off transition of the main switching element 100, and for making the control terminal zero-biased at and after the time t3 after turning off of the main switching element 100. For example, the drive control unit 120 may use one of the first path and fourth path as a path for turning off both between the times t1 and t2 and at and after the time t3. In this case, the drive control unit 120 can use the other of the first path and fourth path for another purpose. In addition, the drive control unit 120 may use different path resistances by using one of the first path and the fourth path during a turn-off transition period and the other path after turning off as explained above.

Note that the switching sequence of performing switching of the control terminal of the main switching element 100 temporarily to the negatively-biased state at the time of turning on or turning off of the main switching element 100, and then making it the zero-biased state (or giving it a bias with a small absolute value) and ending the transition can be employed also for various types of drive apparatuses 110 that can output a positive bias voltage, a negative bias voltage and an intermediate bias voltage. That is, for example, such a switching sequence can be employed in a drive apparatus 110 that receives inputs from two or more power sources, or a drive apparatus 110 in which the resistances of the first to fourth connection resistances R1-4 are substantially the same.

Figure 4:
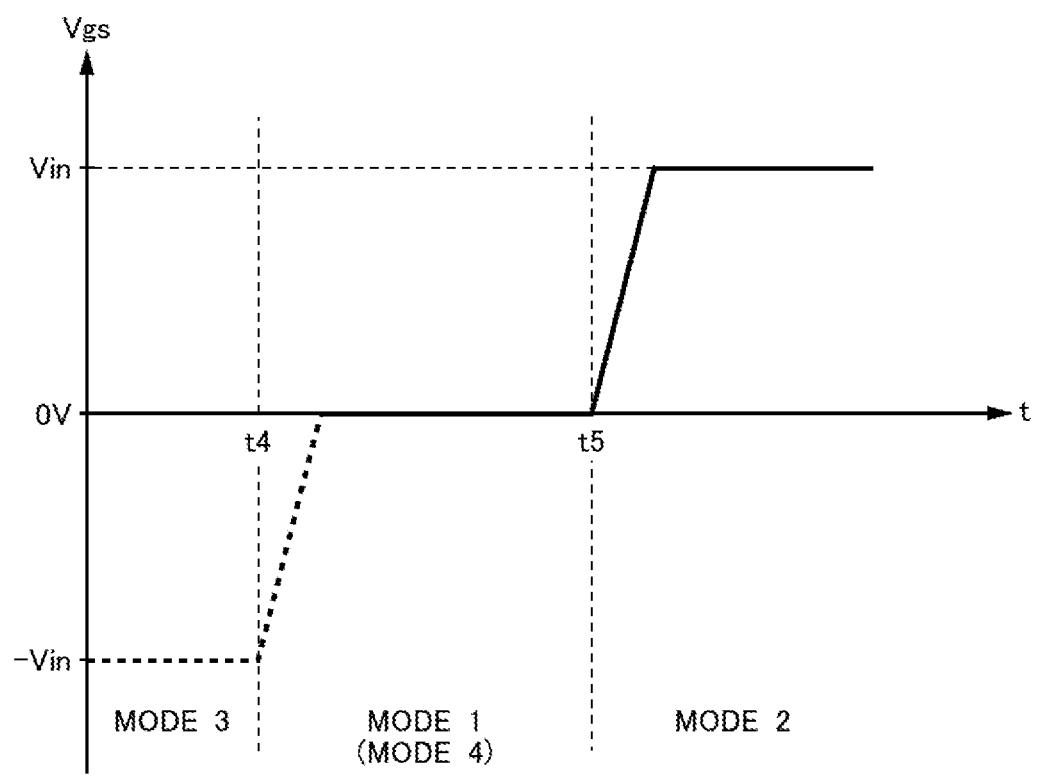
FIG. 4 shows a second example illustrating transitions of a bias voltage across the control terminal of the main switching element 100 according to the present embodiment.

FIG. 4 shows a second example illustrating transitions of a bias voltage across the control terminal of the main switching element 100 according to the present embodiment. In the present example, the drive apparatus 110 turns on the main switching element 100 by changing, to +Vin, the bias voltage Vgs across the control terminal of the main switching element 100 that is turned off in the first example.

If the control terminal of the main switching element 100 is kept negatively biased at the end of turning off of the main switching element 100 shown in the first example, the drive apparatus 110 is in the connection mode 3. In this case, at a time t4, the drive control unit 120 receives an input of the control signal CTL (for example, logic H) instructing to make the main switching element 100 enter the ON-state. Upon receiving it, the drive control unit 120 makes the drive apparatus 110 enter the connection mode 1 (or the connection mode 4), and increases the bias voltage Vgs across the control terminal of the main switching element 100 from −Vin to 0 V. If the threshold voltage Vth of the main switching element 100 has a value between Vin and 0 V, the main switching element 100 continues with the OFF state.

At a time t5, the drive control unit 120 makes the drive apparatus 110 enter the connection mode 2, increases the bias voltage Vgs to +Vin, and turns on the main switching element 100. Here, similar to the period between the times t1 and t2 in the first example, the drive control unit 120 may set the period of the connection mode 1 or connection mode 4 to a predetermined period or longer such that the period during which the bias voltage across the control terminal of the main switching element 100 is maintained at substantially 0 V between the times t4 and t5 becomes a predetermined minimum maintenance period or longer. This minimum maintenance period may be longer than the transition time of a voltage or current between the first to second main terminals that accompanies turning on or turning off of the main switching element 100, and for example may have a value of several hundred ns or larger.

Note that, if the control terminal of the main switching element 100 is zero-biased at the end of turning off of the main switching element 100 shown in the first example, at the time t5, the drive control unit 120 may perform the above-mentioned operation by receiving an input of the control signal CTL (for example, logic H) instructing to make the main switching element 100 enter the ON-state.

In the above-mentioned explanations, at least one among the path resistance of the first path or fourth path used between the times t4 and t5, and the path resistance of the first path or fourth path used at and after the time t5 may be configured to have a different resistance such that they become suitable resistances in those individual periods.

The drive control unit 120 may have, as fixed values in advance, parameters such as the period of the connection mode 1 (connection mode 4) provided between the connection mode 3 and the connection mode 2 (the period between the times t1 and t2), or, instead of this, it may be made possible to configure parameters for the drive control unit 120.

Figure 5:
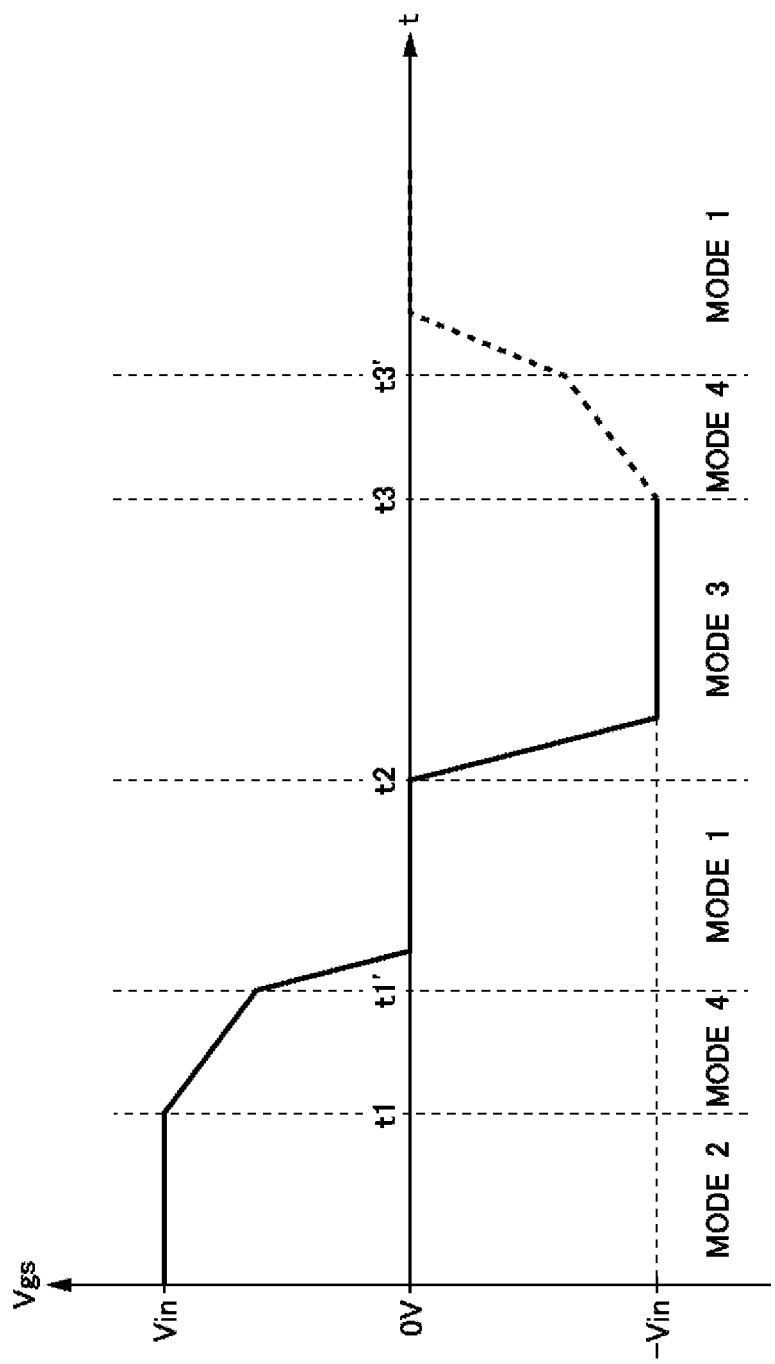
FIG. 5 shows a third example illustrating transitions of a bias voltage across the control terminal of the main switching element 100 according to the present embodiment.

FIG. 5 shows a third example illustrating transitions of a bias voltage across the control terminal of the main switching element 100 according to the present embodiment. The drive control unit 120 may provide both a period for establishing the connection through the first path and a period for establishing the connection through the fourth path during at least one switching of switching from the connection through the second path to the connection through the third path (for example, switching of the bias voltage from +Vin to −Vin) and switching from the connection through the third path to the connection through the second path (for example, switching of the bias voltage from −Vin to +Vin). Thereby, the drive control unit 120 can more suitably configure the voltage waveform of the control terminal using the first path resistance and fourth path resistance that have different resistances in a transition period of turning on and/or turning off of the main switching element 100.

The present example is a variant of the first example, and, in the present example, the drive control unit 120 provides both a period for establishing the connection through the fourth path and a period for establishing the connection through the first path during switching from the connection through the second path to the connection through the third path (that is, between the times t1 and t2). At the time t1, the drive control unit 120 receives an input of the control signal CTL (for example, logic L) to instruct switching of the main switching element 100 to enter the OFF state. Upon receiving it, the drive control unit 120 makes the first to fourth switching elements SW1-4 enter the connection mode 4, and starts lowering the bias voltage Vgs across the control terminal of the main switching element 100 from +Vin. The drive control unit 120 lowers the bias voltage Vgs to a value larger than the threshold voltage Vth. Instead of this, the drive control unit 120 may lower the bias voltage Vgs to a voltage equal to or lower than the threshold voltage Vth.

At a time t1', the drive control unit 120 makes the drive apparatus 110 enter the connection mode 1, and further lowers the bias voltage Vgs from the voltage value observed at the time t1', and changes it to a zero bias. If the threshold voltage Vth of the main switching element 100 has a value between Vin and 0 V (for example 3 to 8 V), the main switching element 100 is turned off.

Here, during switching from the connection through the second path to the connection through the third path, the drive control unit 120 may perform switching to a connection through a path with a smaller resistance among the connection through the first path and the connection through the fourth path after switching to a connection through a path with a larger resistance among the connection through the first path and the connection through the fourth path. In the present example, by setting the fourth path resistance in the connection mode 4 to have a value larger than the first path resistance in the connection mode 1, changes in the bias voltage between the times t1 and t1' become gradual as compared to changes in the bias voltage between the times t1' and t2. Thereby, the drive apparatus 110 can lower the rate of change of the voltage across the first main terminal of the main switching element 100 immediately after starting turning off, and can lower the possibility of occurrences of malfunctions.

The drive control unit 120 may have, as fixed values in advance, parameters such as the period of the connection mode 4 provided between the connection mode 2 and the connection mode 3 (the period between the times t1 and t1') or the period of the connection mode 1 (the period between the times t1' and t2), or, instead of this, it may be made possible to configure the parameters. In addition, the drive apparatus 110 may have a comparator that judges whether or not the voltage across the control terminal of the main switching element 100 became equal to or lower than a predetermined voltage, and the drive control unit 120 may detect the timing of the time t1' using a result of comparison performed by the comparator.

In the present example shown, in the period between the times t1 and t2, the drive control unit 120 performs switching of the first to fourth switching elements SW1-4 in the order of the connection modes 4, 1, but the drive control unit 120 may perform switching in the order of the connection modes 1, 4. In addition, in the period between the times t1 and t2, the drive control unit 120 may first perform switching to a connection mode with a smaller path resistance among the connection modes 1 and 4, and then perform switching to a connection mode with a larger path resistance. Furthermore, in the period between the times t1 and t2, the drive control unit 120 may perform switching between three or more connection modes in order, such as switching in the order of the connection modes 4, 1, 4.

Figure 6:
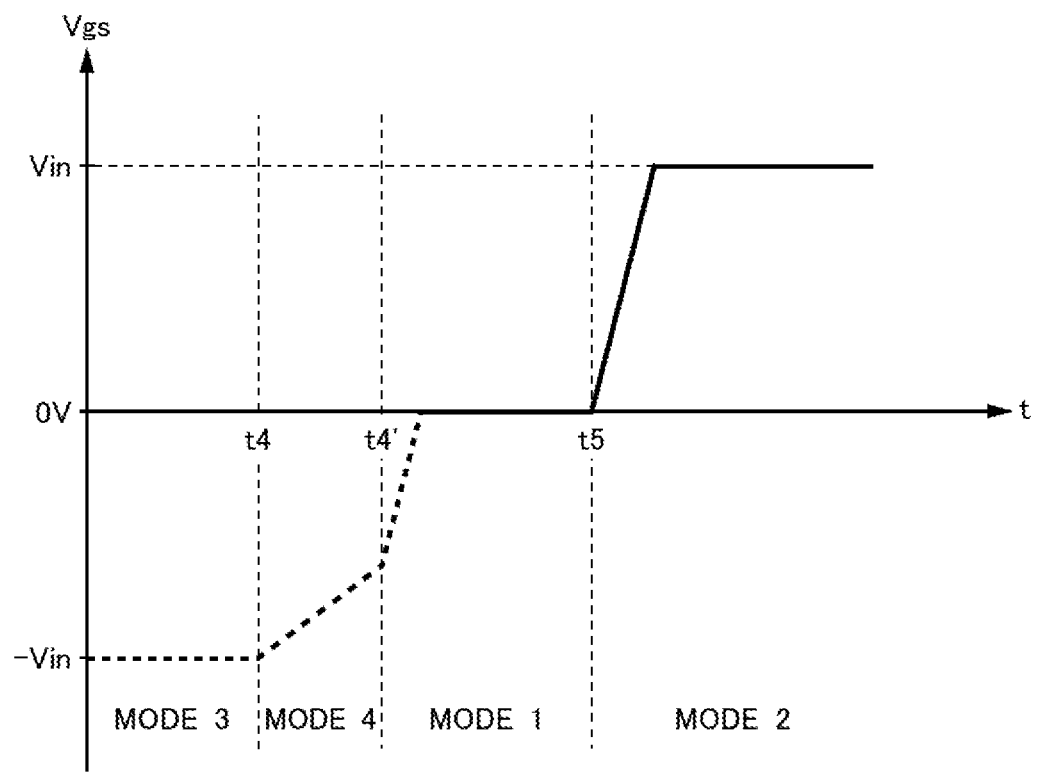
FIG. 6 shows a fourth example illustrating transitions of a bias voltage across the control terminal of the main switching element 100 according to the present embodiment.

FIG. 6 shows a fourth example illustrating transitions of a bias voltage across the control terminal of the main switching element 100 according to the present embodiment. The present example is a variant of the second example, and, in the present example, the drive control unit 120 provides both a period for establishing the connection through the fourth path and a period for establishing the connection through the first path during switching from the connection through the third path to the connection through the second path (that is, between the times t4 and t5). At the time t4, the drive control unit 120 receives an input of the control signal CTL (for example, logic H) instructing to make the main switching element 100 enter the ON-state. Upon receiving it, the drive control unit 120 makes the drive apparatus 110 enter the connection mode 4, and starts increasing the bias voltage Vgs across the control terminal of the main switching element 100 from −Vin.

At a time t4', the drive control unit 120 makes the drive apparatus 110 enter the connection mode 1, and further increases the bias voltage Vgs from the voltage value observed at the time t4', and changes it to a zero bias.

Here, during switching from the connection through the third path to the connection through the second path, the drive control unit 120 may perform switching to a connection through a path with a smaller resistance among the connection through the first path and the connection through the fourth path after switching to a connection through a path with a larger resistance among the connection through the first path and the connection through the fourth path. In the present example, by setting the fourth path resistance in the connection mode 4 to have a value larger than the first path resistance in the connection mode 1, changes in the bias voltage between the times t4 and t4' become gradual as compared to changes in the bias voltage between the times t4' and t5. Thereby, the drive apparatus 110 can lower the rate of change of the voltage across the first main terminal of the main switching element 100 immediately after starting turning on, and can lower the possibility of occurrences of malfunctions.

The drive control unit 120 may have, as fixed values in advance, parameters such as the period of the connection mode 4 provided between the connection mode 3 and the connection mode 2 (the period between the times t4 and t4') or the period of the connection mode 1 (the period between the times t4' and t5), or, instead of this, it may be made possible to configure the parameters for the drive control unit 120. In addition, the drive apparatus 110 may have a comparator that judges whether or not the voltage across the control terminal of the main switching element 100 became equal to or higher than a predetermined voltage, and the drive control unit 120 may detect the timing of the time t4' using a result of comparison performed by the comparator.

In the present example shown, in the period between the times t4 and t5, the drive control unit 120 performs switching of the first to fourth switching elements SW1-4 in the order of the connection modes 4, 1, but the drive control unit 120 may perform switching in the order of the connection modes 1, 4. In addition, in the period between the times t4 and t5, the drive control unit 120 may first perform switching to a connection mode with a smaller path resistance among the connection modes 1 and 4, and then perform switching to a connection mode with a larger path resistance. Furthermore, in the period between the times t4 and t5, the drive control unit 120 may perform switching between three or more connection modes in order, such as switching in the order of the connection modes 4, 1, 4.

Note that, if the main switching element 100 has a positive threshold voltage, and the inductance of the first path and second path is suppressed sufficiently, the drive apparatus 110 can suppress overshoot of the bias voltage Vgs even if a path with a smaller path resistance among the first path and the fourth path is used in the period between the times t4 and t5, and can prevent erroneous turning on of the main switching element 100 in the period between the times t4 and t5. In such a case, the drive control unit 120 may use the bias voltage waveform shown in FIG. 5 when it turns off the main switching element 100, and may use the bias voltage waveform shown in FIG. 4 when it turn on the main switching element 100.

FIG. 7 illustrates a variant of connection modes of the drive apparatus 110 according to the present embodiment. In the present variant, the drive control unit 120 uses connection codes indicating ON/OFF patterns of the first to fourth switching elements SW1-4 to control the connection path between the control terminal and second main terminal of the main switching element 100. For example, a connection code may have a one-bit field corresponding to each among the first to fourth switching elements SW1-4, and each bit may have a value indicating whether a corresponding switching element is turned on or turned off. In the present variant, in a connection code, bit 0 (most-significant bit) indicates the ON/OFF state of the first switching element SW1, bit 1 indicates the ON/OFF state of the second switching element SW2, bit 2 indicates the ON/OFF state of the third switching element SW3, and bit 3 (least-significant bit) indicates the ON/OFF state of the fourth switching element SW4. Each bit is set to "0" if a corresponding switching element is turned on, and is set to "1" if the corresponding switching element is turned off.

The connection modes corresponding to connection codes 3 (binary 0011), 6 (0110), 9 (1001), and 12 (1100) are the same as the connection modes 1-4 in FIG. 2.

In the connection modes corresponding to connection codes 7 (0111), 11 (1011), 13 (1101), and 14 (1110), one of the first to fourth switching elements SW1-4 is turned on, and the rest are turned off. In these connection modes, one of the switching elements which is turned off enters the conducting state via the parasitic diode according to the potential difference between the control terminal and second main terminal of the main switching element 100.

In the connection mode corresponding to the connection code 7, the first switching element SW1 is turned on, and the second switching element SW2 enters the conducting state using the parasitic diode if the potential of the control terminal is lower than the potential of the second main terminal by a difference which is equal to or larger than the forward voltage drop Vd2 of the parasitic diode. In this case, the bias voltage across the control terminal of the main switching element 100, when in the stable state, becomes −Vd2, and the path resistance between the control terminal and the second main terminal becomes "resistance R1+parasitic diode resistance Rd2". Here, if the parasitic diode causes current to flow within the range of ampacity, the path resistance can be substantially regarded as being the resistance R1.

In the connection mode corresponding to the connection code 11, the second switching element SW2 is turned on, and the first switching element SW1 enters the conducting state using the parasitic diode if the potential of the control terminal is higher than the potential of the second main terminal by a difference which is equal to or larger than the forward voltage drop Vd1 of the parasitic diode. In this case, the bias voltage across the control terminal, when in the stable state, becomes Vd1, and the path resistance between the control terminal and the second main terminal becomes "parasitic diode resistance Rd1+resistance R2". Here, if the parasitic diode causes current to flow within the range of ampacity, the path resistance can be substantially regarded as being the resistance R2.

In the connection mode corresponding to the connection code 13, the third switching element SW3 is turned on, and the fourth switching element SW4 enters the conducting state using the parasitic diode if the potential of the control terminal is higher than the potential of the second main terminal by a difference which is equal to or larger than the forward voltage drop Vd4 of the parasitic diode. In this case, the bias voltage across the control terminal, when in the stable state, becomes Vd4, and the path resistance between the control terminal and the second main terminal becomes "resistance R3+parasitic diode resistance Rd4". Here, if the parasitic diode causes current to flow within the range of ampacity, the path resistance can be substantially regarded as being the resistance R3.

In the connection mode corresponding to the connection code 14, the fourth switching element SW4 is turned on, and the third switching element SW3 enters the conducting state using the parasitic diode if the potential of the control terminal is lower than the potential of the second main terminal by a difference which is equal to or larger than the forward voltage drop Vd3 of the parasitic diode. In this case, the bias voltage across the control terminal, when in the stable state, becomes −Vd3, and the path resistance between the control terminal and the second main terminal becomes "parasitic diode resistance Rd3+resistance R4". Here, if the parasitic diode causes current to flow within the range of ampacity, the path resistance can be substantially regarded as being the resistance R4.

In the connection modes corresponding to connection codes 0 (0000), 1 (0001), 2 (0010), 4 (0100), 5 (0101), 8 (1000), and 10 (1010), both the first switching element SW1 and the third switching element SW3 or both the second switching element SW2 and the fourth switching element SW4 are turned on, and the power source 130 short-circuits. Accordingly, the drive control unit 120 may be configured to not use those connection modes, and in the figure the cells for the gate-source voltage Vgs and gate drive resistance are filled with "−". However, if at least one of the resistance R1+R3 and the resistance R2+R4 is sufficiently large, and failures of and an increase of consumed power of switching elements due to short-circuiting do not become issues, the drive control unit 120 may make use of a connection mode in which two switching elements along a path with a sufficiently large resistance are turned on, and the voltage between the control terminal and second main terminal of the main switching element 100 in such a case becomes like ones explained below.

In the connection mode corresponding to the connection code 0, the voltage across the control terminal of the main switching element 100 in the stable state becomes a voltage obtained by dividing Vin by the resistances R1 and R3 using the potential of the negative terminal of the power source 130 as reference potential, and the voltage across the second main terminal of the main switching element 100 becomes a voltage obtained by dividing Vin by the resistances R2 and R4 using the potential of the negative terminal of the power source 130 as reference potential. The difference between those voltages becomes the voltage between the control terminal and the second main terminal.

In the connection mode corresponding to the connection code 1, the bias voltage across the control terminal of the main switching element 100 becomes −Vin×R1/(R1+R3) in the stable state. In the connection mode corresponding to the connection code 2, the bias voltage becomes Vin×R2/(R2+R4) in the stable state. In the connection mode corresponding to the connection code 4, the bias voltage becomes Vin×R3/(R1+R3) in the stable state. In the connection mode corresponding to the connection code 8, the bias voltage becomes −Vin×R2/(R2+R4) in the stable state.

In the connection mode corresponding to the connection code 5, the voltage across the control terminal of the main switching element 100 becomes a voltage obtained by dividing the voltage between the positive terminal and negative terminal of the power source 130 by the resistances R1 and R3. For example, by selecting this connection mode in a situation where the parasitic diode of the second switching element SW2 enters the conducting state, the drive control unit 120 can make the bias voltage across the control terminal of the main switching element 100 equal −Vin×R1/(R1+R3)−Vd2. In addition, by selecting this connection mode in a situation where the parasitic diode of the fourth switching element SW4 enters the conducting state, the drive control unit 120 can make the bias voltage equal Vin×R3/(R1+R3)+Vd4.

In the connection mode corresponding to the connection code 10, the voltage across the second main terminal of the main switching element 100 becomes a voltage obtained by dividing the voltage between the positive terminal and negative terminal of the power source 130 by the resistances R2 and R4. For example, by selecting this connection mode in a situation where the parasitic diode of the first switching element SW1 enters the conducting state, the drive control unit 120 can make the bias voltage equal Vin×R2/(R2+R4)+Vd1. In addition, by selecting this connection mode in a situation where the parasitic diode of the third switching element SW3 enters the conducting state, the drive control unit 120 can make the bias voltage −Vin×R4/(R2+R4)−Vd3.

In the connection mode corresponding to the connection code 15 (binary "1111"), all the first to fourth switching elements SW1-4 are turned off. If a relatively highly resistive protective resistor or the like is connected between the control terminal and second main terminal of the main switching element 100 outside the drive apparatus 110, the drive control unit 120 may be configured to select this connection mode upon detection of a failure.

By using a connection mode corresponding to another connection code as necessary in addition to or instead of each connection mode of the connection code 3, 6, 9, or 12, it becomes possible for the drive apparatus 110 to more finely control the bias voltage and gate-source resistance.

Figure 8:
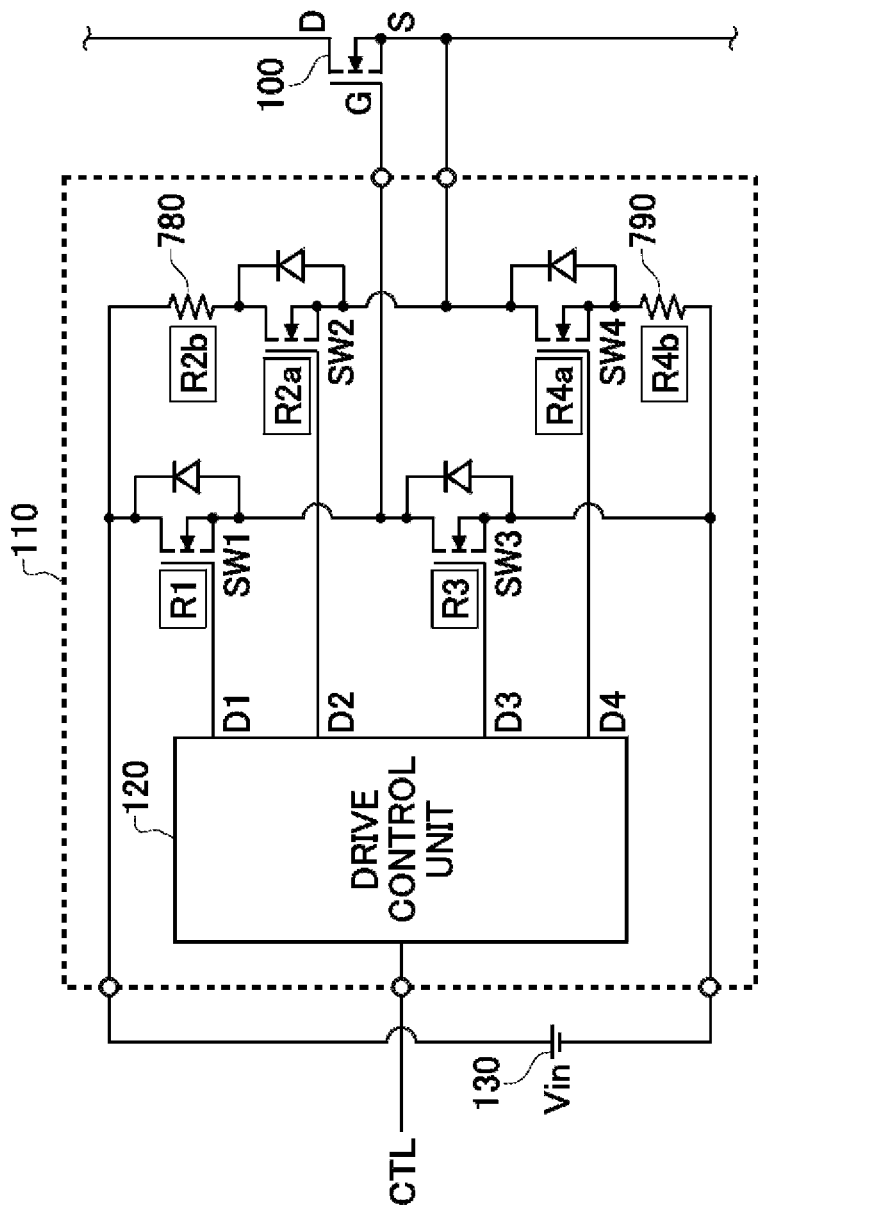
FIG. 8 illustrates the configuration of the switching apparatus 10 according to a first variant.

FIG. 8 illustrates the configuration of the switching apparatus 10 according to a first variant. Components in the present variant that are given the same signs as those in FIG. 1 have the same configurations and functions as those in FIG. 1, so explanations thereof are not repeated below unless they are necessary.

In the configuration employed for the drive apparatus 110, at least one of the second connection resistance R2 and the fourth connection resistance R4 may be larger than the first connection resistance R1 and third connection resistance R3. In the present variant, the drive apparatus 110 further includes a resistor 780 provided in the second connection path and a resistor 790 provided in the fourth connection path.

The resistor 780 is one example of a first resistive element, and is connected between the positive terminal of the power source 130 and the second main terminal of the main switching element 100 and in series with the second switching element SW2. The resistor 780 may be a resistive element that can be formed on an integrated circuit such as a polysilicon resistor. Thereby, the second connection resistance R2 in the second connection path becomes the sum of the resistance R2a of the second switching element SW2 and the resistance R2b of the resistor 780. The resistor 790 is one example of a second resistive element, and is connected between the second main terminal of the main switching element 100 and the negative terminal of the power source 130 and in series with the fourth switching element. The resistor 790 also may be a resistive element such as a polysilicon resistor that can be formed on an integrated circuit. Thereby, the fourth connection resistance R4 in the fourth connection path becomes the sum of the resistance R4a of the fourth switching element SW4 and the resistance R4b of the resistor 790.

FIG. 9 illustrates connection modes of the switching apparatus 10 according to the first variant. In this this figure, the second connection resistance R2 in FIG. 2 is replaced with R2a+R2b, and the fourth connection resistance R4 in FIG. 2 is replaced with R4a+R4b. In other respects, it is the same as FIG. 2.

By connecting a resistive element(s) in series with a corresponding one(s) among the first to fourth switching elements SW1-4 in at least one of the first to fourth connection paths, a connection resistance of each connection path can be adjusted also if the same switching elements are used. Thereby, a path resistance of each among the connection modes 1-4 can be configured to have a suitable value.

Note that, instead of or in addition to connecting the resistors in series with the first to fourth switching elements SW1-4, the ON-resistances of the first to fourth switching elements SW1-4 themselves may be adjusted by changing the channel widths and/or channel lengths of the first to fourth switching elements SW1-4, and so on.

In addition, the configuration employed for the drive apparatus 110 may include one of the resistor 780 and the resistor 790, for example, may include the resistor 780 but not include the resistor 790 or may not include the resistor 780 but include the resistor 790, such that a path resistance assumes preferable magnitude in each connection mode. In addition, the drive apparatus 110 may have a resistive element(s) connected in series with a corresponding one(s) of the first to second switching elements SW1-2 in at least one of the first connection path and the second connection path.

In the switching apparatus 10 according to the first variant also, at least one of various types of connection modes like those shown in FIG. 7 may be employed similar to the switching apparatus 10 shown in FIGS. 1-6.

Figure 10:
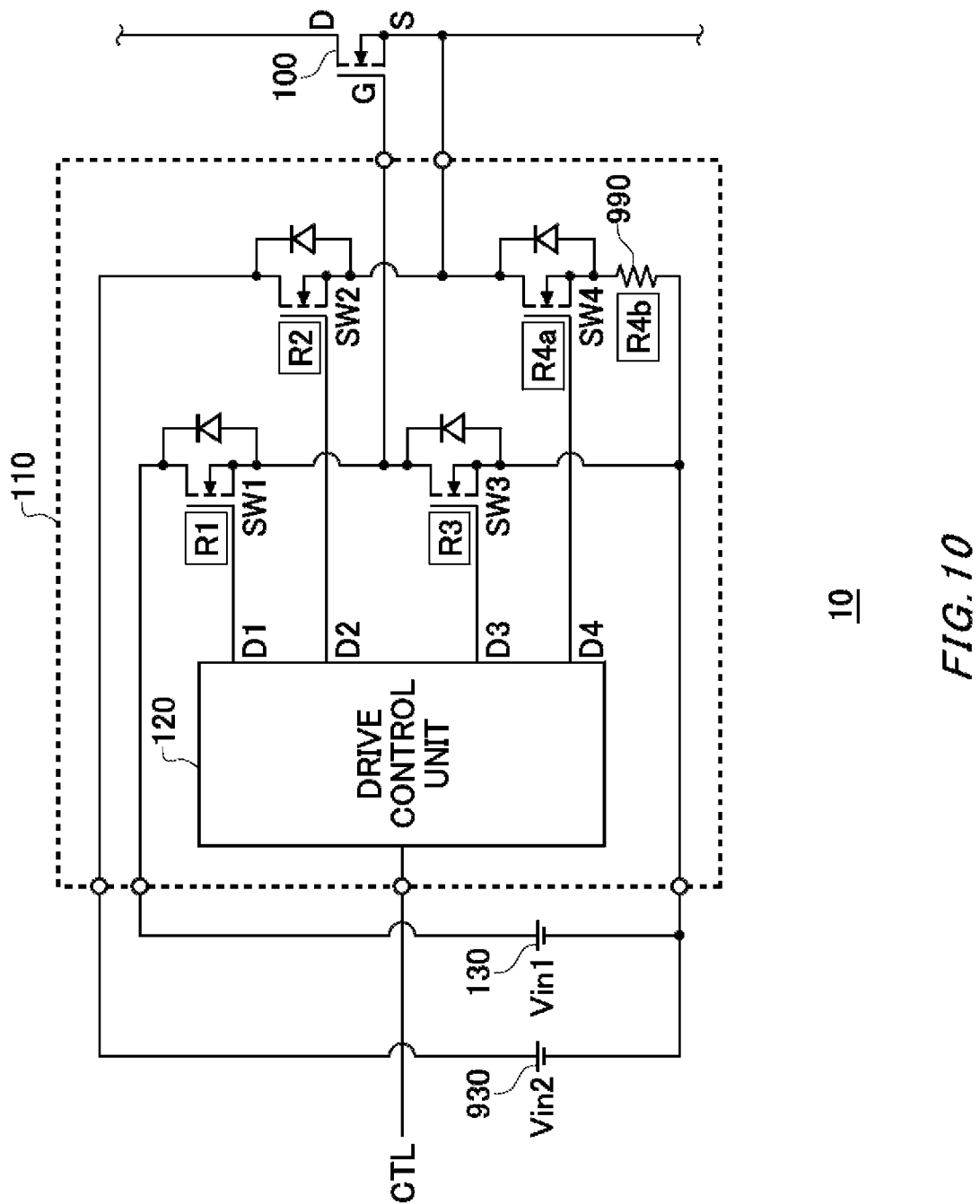
FIG. 10 illustrates the configuration of the switching apparatus 10 according to a second variant.

FIG. 10 illustrates the configuration of the switching apparatus 10 according to a second variant. Components in the present variant that are given the same signs as those in FIG. 1 have the same configurations and functions as those in FIG. 1, so explanations thereof are not repeated below unless they are necessary.

In the present variant, the switching apparatus 10 includes two power sources, the power source 130 and a power source 930. The power source 130 is one example of a first power source, and generates, between the positive terminal and the negative terminal, a power source voltage Vin1 that the drive apparatus 110 uses for applying a positive bias voltage between the control terminal and second main terminal of the main switching element 100. The power source 930 is one example of a second power source, and generates, between the positive terminal and the negative terminal, a power source voltage Vin2 that the drive apparatus 110 uses for applying a negative bias voltage between the control terminal and second main terminal of the main switching element 100. Here, the power source 930 has an output voltage that is different from that of the power source 130.

In the present variant, the first switching element SW1 in the drive apparatus 110 is electrically connected between the positive terminal of the power source 130 and the control terminal of the main switching element 100. The second switching element SW2 is electrically connected between the positive terminal and second main terminal of the power source 930. The third switching element SW3 is electrically connected between the control terminal of the main switching element 100 and the negative terminals of the power source 130 and power source 930. The fourth switching element is electrically connected between the second main terminal of the main switching element 100 and the negative terminals of the power source 130 and power source 930.

In addition, in the present variant, the drive apparatus 110 further includes a resistor 990 provided in the fourth connection path. The resistor 990 is one example of a second resistive element, and is connected between the second main terminal of the main switching element 100 and the negative terminal of the power source 130 and in series with the fourth switching element. The resistor 990 may be a resistive element such as a polysilicon resistor that can be formed on an integrated circuit. Thereby, the fourth connection resistance R4 in the fourth connection path becomes the sum of the resistance R4a of the fourth switching element SW4 and the resistance R4b of the resistor 990.

FIG. 11 illustrates connection modes of the switching apparatus 10 according to the second variant. In this figure, the fourth connection resistance R4 in FIG. 2 is replaced with R4a+R4b, the bias voltage Vgs in the connection mode 1 in FIG. 2 is replaced with Vin1−Vin 2, and the bias voltage Vgs in the connection mode 3 in FIG. 2 is replaced with −Vin 2. In other respects, it is the same as FIG. 2.

In the connection mode 1, the drive apparatus 110 forms a first path that establishes a connection between the control terminal and second main terminal of the main switching element 100 via the first switching element SW1, power source 130, power source 930 and fourth switching element SW4. In this first path, the power source 130 is included in the forward direction, the power source 930 is included in the reverse direction, and the voltage between the control terminal and the second main terminal can be regarded as being the power source voltage Vin1−Vin 2, when in the stable state.

In the present variant, the drive apparatus 110 can provide four types of the bias voltage Vgs to the control terminal of the main switching element 100 using the two power sources, the power source 130 and power source 930. By properly using two types of intermediate biases of the connection mode 1 and connection mode 4 in addition to a positive bias in the connection mode 2 and a negative bias in the connection mode 3 for different purposes, the drive control unit 120 can make the waveform of the bias voltage a suitable waveform. For example, if Vin 1>Vin 2, it becomes also possible for the drive control unit 120 to use the connection mode 1 in the period between the times t1 and t1' in FIG. 5 to lower the bias voltage Vgs to Vin1−Vin 2, and use the connection mode 4 in the period between the times t1' and t2 to lower the bias voltage Vgs to 0 V. In addition, for example, if Vin 1<Vin 2, it becomes also possible for the drive control unit 120 to use the connection mode 1 in the period between the times t3 and t3' in FIG. 5 to increase the bias voltage Vgs to Vin1−Vin 2, and use the connection mode 4 in the period at and after the time t3 to increase the bias voltage Vgs to 0 V.

Note that, in the switching apparatus 10 according to the second variant also, at least one of various types of connection modes like those shown in FIG. 7 may be employed similar to the switching apparatus 10 shown in FIGS. 1-6.

Figure 12:
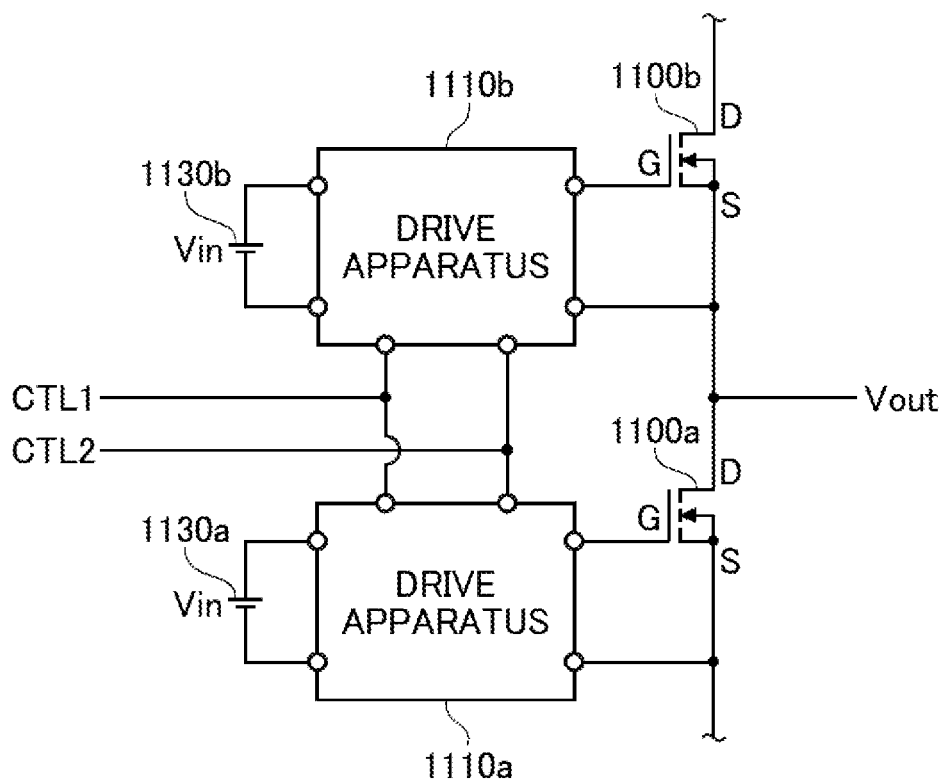
FIG. 12 illustrates the configuration of the switching apparatus 10 according to a third variant.

FIG. 12 illustrates the configuration of the switching apparatus 10 according to a third variant. The switching apparatus 10 according to the present variant includes main switching elements 1100a-b, drive apparatuses 1110a-b and power sources 1130a-b. In the present variant, the main switching elements 1100a-b are the same as the main switching element 100 in FIG. 1, the drive apparatuses 1110a-b are almost the same as the drive apparatus 110 in FIG. 1, and the power sources 1130a-b are the same as the power source 130 in FIG. 1, so explanations thereof are not repeated below except for those related to differences therebetween.

The main switching elements 1100a-b are connected in series such that the first main terminal of the main switching element 1100a on the lower side and the second main terminal of the main switching element 1100b on the higher side are connected, and an output voltage Vout is output from the output terminal between the main switching element 1100a and the main switching element 1100b. If control is performed such that the main switching element 1100a is turned on and the main switching element 1100b is turned off, the output terminal is electrically connected to the second main terminal side of the main switching element 1100a, and if control is performed such that the main switching element 1100a is turned off and the main switching element 1100b is turned on, the output terminal is electrically connected to the first main terminal side of the main switching element 1100b.

Upon being supplied with the power source voltage Vin from the power source 1130a, the drive apparatus 1110a drives the control terminal of the main switching element 1100a according to a control signal CTL1 input from the outside. The drive apparatus 1110a according to the present variant also receives an input of a control signal CTL2 for controlling the main switching element 1100b, which is an opposite switching element connected in series with the main switching element 1100a which is a control target. The drive control unit 120 in the drive apparatus 1110a has the function of driving the control terminal of the main switching element 1100a according to the control signal CTL2. This function is described below in explanations with reference to FIG. 13.

Upon being supplied with the power source voltage Vin from the power source 1130b, the drive apparatus 1110b drives the control terminal of the main switching element 1100b according to the control signal CTL2 input from the outside. The drive apparatus 1110b according to the present variant also receives an input of the control signal CTL1 for controlling the main switching element 1100a, which is an opposite switching element connected in series with the main switching element 1100b which is a control target. The drive control unit 120 in the drive apparatus 1110b has the function of driving the control terminal of the main switching element 1100b according to the control signal CTL1, and this function is described below in explanations with reference to FIG. 13.

The power sources 1130a-b generate the power source voltage Vin between the positive terminal and the negative terminal, and supplies it to the drive apparatuses 1110a-b.

Figure 13:
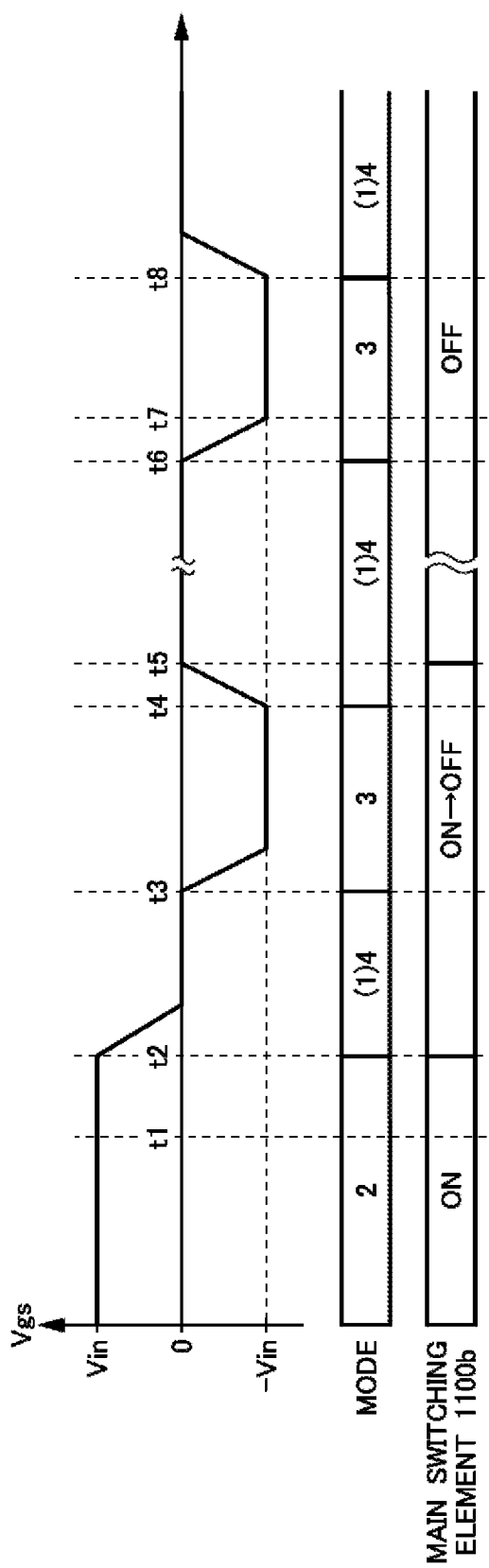
FIG. 13 illustrates transitions of bias voltages across the control terminals of main switching elements 1100a-b according to the third variant.
Figure 13:
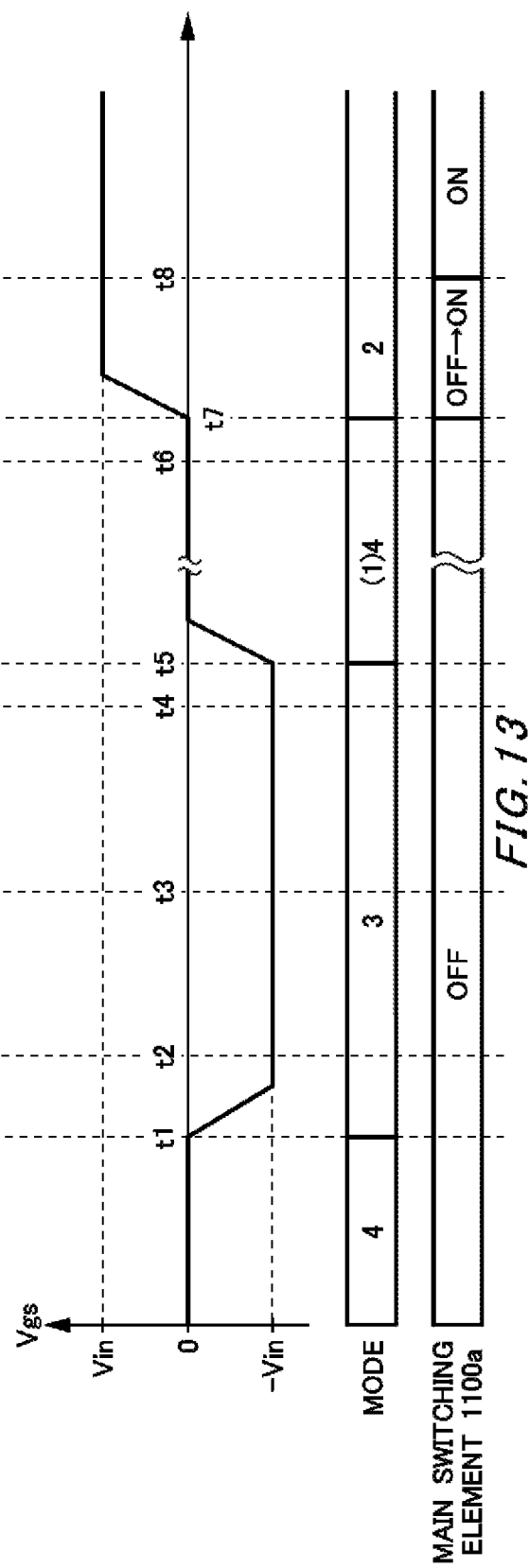

FIG. 13 illustrates transitions of bias voltages across control terminals of the main switching elements 1100a-b according to the third variant. In the present variant, the drive control units 120 in the drive apparatuses 1110a-b have the function of performing switching from the connection through the first path or the connection through the fourth path to the connection through the third path before switching of an opposite switching element (the main switching element 1100b or 1100a) connected in series with the main switching element 1100a or 1100b which is the control target in an OFF-period of the main switching element 1100a or 1100b which is the control target (an ON-period in a main switching element 1100 which is turned off if Vgs>Vth).

The lower half of this figure illustrates temporal changes of the bias voltage Vgs applied to the control terminal of the main switching element 1100a, the connection mode of the drive apparatus 1110a, and the ON/OFF state of the main switching element 1100a. The upper half of this figure illustrates temporal changes of the bias voltage Vgs applied to the control terminal of the main switching element 1100b, the connection mode of the drive apparatus 1110b, and the ON/OFF state of the main switching element 1100b.

At and before the time t1, the drive control unit 120 in the drive apparatus 1110a makes the drive apparatus 1110a enter the connection mode 4, and makes the main switching element 1100a enter the OFF state. The drive control unit 120 in the drive apparatus 1110b makes the drive apparatus 1110b enter the connection mode 2, and makes the main switching element 1100b enter the ON-state. At the time t1, upon receiving an input of the control signal CTL2 (for example, logic L) instructing to make the main switching element 1100b enter the OFF state, the drive control unit 120 in the drive apparatus 1110b accordingly turns off the main switching element 1100b over the time range between the times t2 and t5 that follows micro time after the time t1. This process related to turning off and the waveform of a bias voltage are the same as those in FIG. 3, so explanations thereof are not repeated.

Upon receiving, at the time t1, an input of the control signal CTL2 (for example, logic L) instructing to make the main switching element 1100b, which is the opposite switching element, enter the OFF state, the drive control unit 120 in the drive apparatus 1110a makes the drive apparatus 1110a enter the connection mode 3 before switching of the main switching element 1100b, and performs switching from the connection through the fourth path (or the connection through the first path) to the connection through the third path. After maintaining the connection through the third path until the transition period of turning off of the main switching element 1100b ends, that is, for example until the time t5, the drive control unit 120 in the drive apparatus 1110a may perform switching back of the drive apparatus 1110a to the connection mode 1 or 4, and continue with the OFF state of the main switching element 1100a.

In addition, upon receiving, at the time t6, an input of the control signal CTL1 (for example, logic H) instructing to make the main switching element 1100a enter the ON-state, the drive control unit 120 in the drive apparatus 1110a accordingly turns on the main switching element 1100a over the time range between the times t7 and t8 that follows micro time after the time t6. This process related to turning on and the waveform of a bias voltage are the same as those in FIG. 4, so explanations thereof are not repeated.

Upon receiving, at the time t6, an input of the control signal CTL1 (for example, logic H) instructing to make the main switching element 1100a enter the ON-state, the drive control unit 120 in the drive apparatus 1110b makes the drive apparatus 1110b enter the connection mode 3 before switching of the main switching element 1100a, and performs switching from the connection through the fourth path (or the connection through the first path) to the connection through the third path. After maintaining the connection through the third path until the transition period of turning on of the main switching element 1100a ends, that is, for example until the time t8, the drive control unit 120 in the drive apparatus 1110b may perform switching back of the drive apparatus 1110b to the connection mode 1 or 4, and continue with the OFF state of the main switching element 1100b.

With the drive apparatuses 1110a-b according to the present variant, by applying a negative bias voltage to the control terminals of the main switching elements 1100a-b before switching of an opposite switching element, it is possible to prevent the main switching element 1100 from being erroneously turned on due to noises or the like that result from abrupt current changes generated by switching of the opposite switching element.

Figure 14:
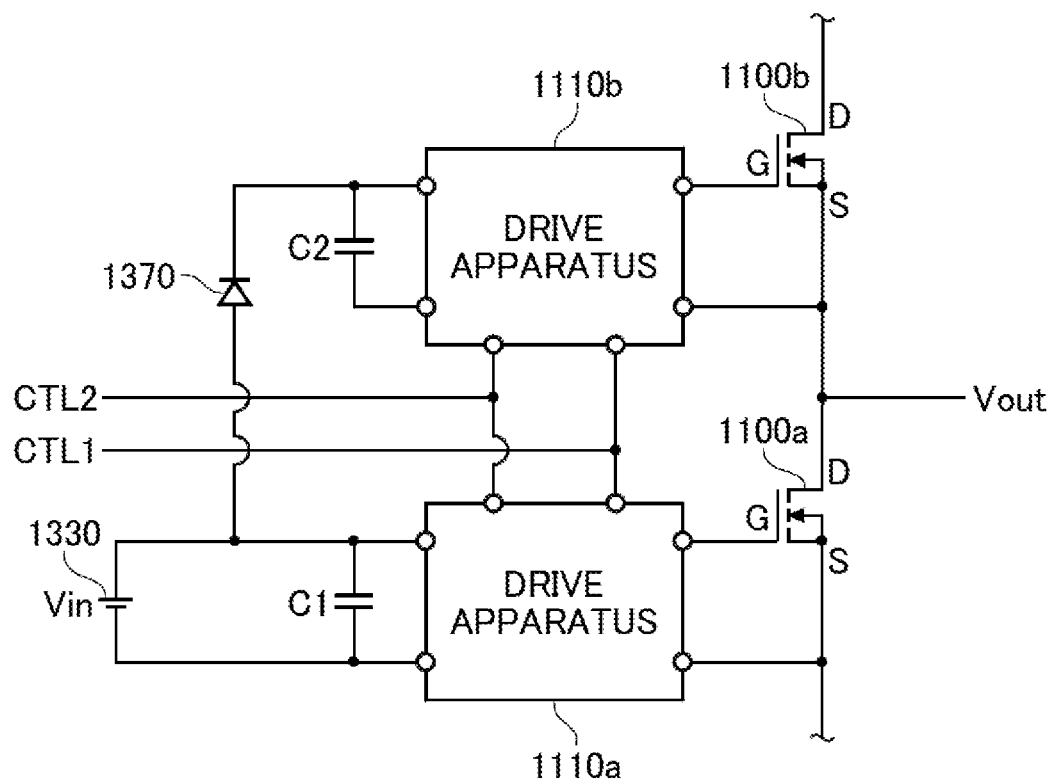
FIG. 14 illustrates the configuration of the switching apparatus 10 according to a fourth variant.

FIG. 14 illustrates the configuration of the switching apparatus 10 according to a fourth variant. The switching apparatus 10 according to the present variant includes the main switching elements 1100a-b, the drive apparatuses 1110a-b, a power source 1330, and a diode 1370. Components in the present variant that are given the same signs as those in FIG. 12 have the same configurations as those in FIG. 12, so explanations thereof are not repeated below except for those related to differences.

The power source 1330 generates the power source voltage Vin between the positive terminal and the negative terminal. Similar to the power source 1130a in FIG. 12, the capacitor C1 has a positive terminal that is connected to the first main terminals of the first to second switching elements SW1-2 in the drive apparatus 1110a, and has a negative terminal that is connected to the second main terminals of the third to fourth switching element SW3-4 in the drive apparatus 1110a. The capacitor C1 is charged by the power source voltage Vin of the power source 1330, and functions as a power source for the drive apparatus 1110a.

Similar to the power source 1130b in FIG. 12, the capacitor C2 has a positive terminal that is connected to the first main terminals of the first to second switching elements SW1-2 in the drive apparatus 1110b, and has a negative terminal that is connected to the second main terminals of the third to fourth switching element SW3-4 in the drive apparatus 1110b. The capacitor C2 is charged by the power source voltage Vin of the power source 1330, and functions as a power source for the drive apparatus 1110b.

The diode 1370 has an anode that is connected to the positive terminal side of the power source 1130, has a cathode that is connected to the positive terminal side of the capacitor C2, causes charging current to flow from the power source 1130 to the capacitor C2, and prevents reverse flow of current from the drive apparatus 1110b to the power source 1130 side.

With the above-mentioned configuration, the main switching element 1000 can use the single power source 1330 to charge the capacitors C1-C2, and supply the drive apparatuses 1110a-b with a power source voltage. Here, the capacitor C1 can be directly charged by the power source 1130. However, the potential on the second main terminal side of the main switching element 1100b varies according to switching of the main switching elements 1100a-b, and accordingly the potential of the negative terminal of the capacitor C2 also varies; therefore, the period during which the capacitor C2 can be charged is limited. In the present variant, the drive control unit 120 in the drive apparatus 1110b makes the drive apparatus 1110b enter the connection mode 4 while the drive apparatus 1110a is in the connection mode 2 and the main switching element 1100a is in the ON-state. At this time, the portion between the second positive terminal of the main switching element 1100a, and the capacitor C1 and the negative terminal of the power source 1330 enters the conducting state via the fourth switching element SW4 in the ON-state, the portion between the second positive terminal of the main switching element 1100a and the second positive terminal of the main switching element 1100b enters the conducting state via the main switching element 1100a in the ON-state, and the portion between the second positive terminal of the main switching element 1100b and the negative terminal of the capacitor C2 enters the conducting state via the fourth switching element SW4 in the ON-state. Accordingly, the negative terminal of the capacitor C2 is at almost the same potential as the negative terminal of the power source 1330, the power source voltage Vin is supplied from the positive terminal of the power source 1330 to the capacitor C2 via the diode 1370, and the capacitor C2 is charged to the voltage Vin.

In this manner, by providing the capacitors C1-C2 in the drive apparatuses 1110a-b, and appropriately selecting the connection modes in the drive apparatuses 1110a-b, the switching apparatus 10 can use the single power source 1330 to drive the control terminals of the main switching elements 1100a-b connected in series.

Note that, in the present variant, the drive apparatus 1110b is caused to enter the connection mode 4 to charge the capacitor C2 while the drive apparatus 1110a is in the connection mode 2. Because of this, in the present variant, the drive control unit 120 in the drive apparatus 1110b may not have the function of making the drive apparatus 1110b enter the connection mode 3 in the period between the times t7 and t8 in FIG. 13.

Various embodiments of the present invention may be described with reference to flowcharts and block diagrams whose blocks may represent sections of apparatuses responsible for performing operations. Certain sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY(registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A drive apparatus that drives a control terminal of a main switching element that establishes or cuts off an electrical connection between a first main terminal and a second main terminal, the drive apparatus comprising:
    a first switching element that establishes or cuts off an electrical connection between a positive terminal of at least one power source and the control terminal;
    a second switching element that establishes or cuts off an electrical connection between the positive terminal of the power source and the second main terminal;
    a third switching element that establishes or cuts off an electrical connection between the control terminal and a negative terminal of the power source;
    a fourth switching element that establishes or cuts off an electrical connection between the second main terminal and the negative terminal of the power source; and
    a drive control unit that individually controls opening and closing of each of the first switching element, the second switching element, the third switching element and the fourth switching element, wherein
    at least one resistance among: a first path resistance in a first path establishing a connection between the control terminal and the second main terminal via the first switching element and the second switching element a second path resistance in a second path establishing a connection between the control terminal and the second main terminal via the first switching element and the fourth switching element a third path resistance in a third path establishing a connection between the control terminal and the second main terminal via the second switching element and the third switching element and a fourth path resistance in a fourth path establishing a connection between the control terminal and the second main terminal via the third switching element and the fourth switching element, is different from at least one of the other resistances,
    during at least one switching of: switching from a connection through the second path to a connection through the third path; and switching from the connection through the third path to the connection through the second path, the drive control unit provides at least one of a period in which a connection through the first path is established and a period in which a connection through the fourth path is established,
    a bias voltage applied to the control terminal of the main switching element is maintained at substantially 0V during the at least one of the period, and
    the at least one of the period is longer than a transition time of a voltage or a current between the first main terminal and the second main terminal that accompanies turning on or turning off of the main switching element.

2. The drive apparatus according to claim 1, wherein at least one resistance among: a first connection resistance between the positive terminal of the power source and the control terminal via the first switching element; a second connection resistance between the positive terminal of the power source and the second main terminal via the second switching element; a third connection resistance between the control terminal and the negative terminal of the power source via the third switching element; and a fourth connection resistance between the second main terminal and the negative terminal of the power source via the fourth switching element, is different from at least one of the other resistances.

3. The drive apparatus according to claim 2, wherein at least one of the second connection resistance and the fourth connection resistance is larger than the first connection resistance and the third connection resistance.

4. The drive apparatus according to claim 3, further comprising at least one of:
a first resistive element connected between the positive terminal of the power source and the second main terminal and in series with the second switching element; and
a second resistive element connected between the second main terminal and the negative terminal of the power source and in series with the fourth switching element.

5. The drive apparatus according to claim 4, wherein
the at least one power source includes a first power source and a second power source that have different output voltages,
the first switching element is electrically connected between a positive terminal of the first power source and the control terminal,
the second switching element is electrically connected between a positive terminal of the second power source and the second main terminal,
the third switching element is electrically connected between the control terminal and negative terminals of the first power source and the second power source, and
the fourth switching element is electrically connected between the second main terminal and the negative terminals of the first power source and the second power source.

6. The drive apparatus according to claim 1, wherein the second path resistance and the third path resistance have different resistances.

7. The drive apparatus according to claim 1, wherein the first path resistance and the fourth path resistance have different resistances.

8. The drive apparatus according to claim 1, wherein, during at least one switching of: switching from the connection through the second path to the connection through the third path; and switching from the connection through the third path to the connection through the second path, the drive control unit performs switching to a connection through a path with a larger resistance among the first path and the fourth path, and then performs switching to a connection through a path with a smaller resistance among the first path and the fourth path.

9. The drive apparatus according to claim 1, wherein in switching of the main switching element, the drive control unit performs switching from the connection through the second path to the connection through the third path, and then performs switching to the connection through the first path or the connection through the fourth path to end the switching of the main switching element.

10. The drive apparatus according to claim 9, wherein in switching of the main switching element, the drive control unit performs switching from the connection through the second path to the connection through the third path, and then performs switching to a connection through a path with a smaller resistance among the first path and the fourth path to end the switching of the main switching element.

11. The drive apparatus according to claim 1, wherein the drive control unit can configure which of the connection through the first path and the connection through the fourth path is used in a connection state where the control terminal and second main terminal of the main switching element are connected bypassing the power source.

12. The drive apparatus according to claim 1, in an ON-period or an OFF-period of the main switching element, the drive control unit performs switching from the connection through the first path or the fourth path to the connection through the third path before switching of an opposite switching element connected in series with the main switching element.

13. A drive apparatus that drives a control terminal of a main switching element that establishes or cuts off an electrical connection between a first main terminal and a second main terminal, the drive apparatus comprising:
a first switching element that establishes or cuts off an electrical connection between a positive terminal of a power source and the control terminal;
a second switching element that establishes or cuts off an electrical connection between the positive terminal of the power source and the second main terminal;
a third switching element that establishes or cuts off an electrical connection between the control terminal and a negative terminal of the power source;
a fourth switching element that establishes or cuts off an electrical connection between the second main terminal and the negative terminal of the power source; and
a drive control unit that individually controls opening and closing of each of the first switching element, the second switching element, the third switching element and the fourth switching element, wherein
during at least one switching of: switching from a connection through a second path establishing a connection between the control terminal and the second main terminal via the first switching element and the fourth switching element to a connection through a third path establishing a connection between the control terminal and the second main terminal via the second switching element and the third switching element; and switching from a connection through the third path to a connection through the second path, the drive control unit provides at least one of: a period during which a connection through a first path to establish a connection between the control terminal and the second main terminal is established via the first switching element and the second switching element; and a period during which a connection through a fourth path to establish a connection between the control terminal and the second main terminal is established via the third switching element and the fourth switching element,
a bias voltage applied to the control terminal of the main switching element is maintained at substantially 0V during the at least one of the period, and
the at least one of the period is longer than a transition time of a voltage or a current between the first main terminal and the second main terminal that accompanies turning on or turning off of the main switching element.

14. A switching apparatus comprising:
the drive apparatus according to claim 1; and
the main switching element.

15. A switching apparatus comprising:
the drive apparatus according to claim 13; and
the main switching element.

16. A drive apparatus that drives a control terminal of a main switching element that establishes or cuts off an electrical connection between a first main terminal and a second main terminal, the drive apparatus comprising:
a first switching element that establishes or cuts off an electrical connection between a positive terminal of at least one power source and the control terminal;
a second switching element that establishes or cuts off an electrical connection between the positive terminal of the power source and the second main terminal;

a third switching element that establishes or cuts off an electrical connection between the control terminal and a negative terminal of the power source; and a fourth switching element that establishes or cuts off an electrical connection between the second main terminal and the negative terminal of the power source, at least one of a first resistive element connected between the positive terminal of the power source and the second main terminal and in series with the second switching element; and a second resistive element connected between the second main terminal and the negative terminal of the power source and in series with the fourth switching element; wherein at least one resistance among: a first connection resistance between the positive terminal of the power source and the control terminal via the first switching element; a second connection resistance between the positive terminal of the power source and the second main terminal via the second switching element; a third connection resistance between the control terminal and the negative terminal of the power source via the third switching element; and a fourth connection resistance between the second main terminal and the negative terminal of the power source via the fourth switching element, is different from at least one of the other resistances, at least one of the second connection resistance and the fourth connection resistance is larger than the first connection resistance and the third connection resistance, the at least one power source includes a first power source and a second power source that have different output voltages, the first switching element is electrically connected between a positive terminal of the first power source and the control terminal, the second switching element is electrically connected between a positive terminal of the second power source and the second main terminal, the third switching element is electrically connected between the control terminal and negative terminals of the first power source and the second power source, and the fourth switching element is electrically connected between the second main terminal and the negative terminals of the first power source and the second power source.

17. The drive apparatus according to claim 16, wherein at least one resistance among: a first path resistance in a first path establishing a connection between the control terminal and the second main terminal via the first switching element and the second switching element; a second path resistance in a second path establishing a connection between the control terminal and the second main terminal via the first switching element and the fourth switching element; a third path resistance in a third path establishing a connection between the control terminal and the second main terminal via the second switching element and the third switching element; and a fourth path resistance in a fourth path establishing a connection between the control terminal and the second main terminal via the third switching element and the fourth switching element, is different from at least one of the other resistances.

18. The drive apparatus according to claim 1, wherein the drive control unit outputs four drive signals to the first switching element, the second switching element, the third switching element and the fourth switching element to individually controls the opening and closing of each of the first switching element, the second switching element, the third switching element and the fourth switching element.

19. The drive apparatus according to claim 13, wherein the drive control unit outputs four drive signals to the first switching element, the second switching element, the third switching element and the fourth switching element to individually controls the opening and closing of each of the first switching element, the second switching element, the third switching element and the fourth switching element.

20. A drive apparatus that drives a control terminal of a main switching element that establishes or cuts off an electrical connection between a first main terminal and a second main terminal, the drive apparatus comprising:

a first switching element that establishes or cuts off an electrical connection between a positive terminal of at least one power source and the control terminal;

a second switching element that establishes or cuts off an electrical connection between the positive terminal of the power source and the second main terminal;

a third switching element that establishes or cuts off an electrical connection between the control terminal and a negative terminal of the power source;

a fourth switching element that establishes or cuts off an electrical connection between the second main terminal and the negative terminal of the power source;

a drive control unit that individually controls opening and closing of each of the first switching element, the second switching element, the third switching element and the fourth switching element, and a second resistive element connected between the second main terminal and the negative terminal of the power source and in series with the fourth switching element.

* * * * *